United States Patent
Sugiyama et al.

(10) Patent No.: US 10,785,876 B2
(45) Date of Patent: Sep. 22, 2020

(54) INTERMEDIATE PRINTED BOARD FOR MAKING MULTIPLE PRINTED CIRCUIT BOARDS AND METHOD OF MANUFACTURING THE SAME

(71) Applicant: TAIYO YUDEN CO., LTD., Tokyo (JP)

(72) Inventors: Yuichi Sugiyama, Tokyo (JP); Masashi Miyazaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/056,171

(22) Filed: Aug. 6, 2018

(65) Prior Publication Data
US 2019/0053380 A1    Feb. 14, 2019

(30) Foreign Application Priority Data

Aug. 10, 2017 (JP) ................................ 2017-156003

(51) Int. Cl.
*H05K 1/02* (2006.01)
*H05K 1/05* (2006.01)
(Continued)

(52) U.S. Cl.
CPC ......... *H05K 3/0052* (2013.01); *H05K 1/0281* (2013.01); *H05K 3/44* (2013.01);
(Continued)

(58) Field of Classification Search
CPC .. H05K 3/0052; H05K 1/0281; H05K 3/4664; H05K 3/44
See application file for complete search history.

(56) References Cited

U.S. PATENT DOCUMENTS

| 4,769,270 A | * | 9/1988 | Nagamatsu | ............ | H05K 1/056 174/255 |
| 6,976,415 B2 | * | 12/2005 | Suzuki | .................... | B32B 15/08 83/51 |

(Continued)

FOREIGN PATENT DOCUMENTS

| JP | 2004-31730 A | 1/2004 |
| JP | 2004-311849 A | 11/2004 |

(Continued)

OTHER PUBLICATIONS

Japanese Office Action dated Jun. 11, 2019, in a counterpart Japanese patent application No. 2017-156003. (A machine translation (not reviewed for accuracy) attached.).

*Primary Examiner* — Ishwarbhai B Patel
(74) *Attorney, Agent, or Firm* — Chen Yoshimura LLP

(57) ABSTRACT

An intermediate printed board has a plurality of unit regions that are to be cut out and separated to become a plurality of individual printed circuit boards, respectively. The intermediate printed board includes a metal core substrate including: a metal layer; and a plating layer formed on each of a top surface and a bottom surface of the metal layer, the plating layer being absent in each of cutting regions, the cutting regions being regions on the intermediate printed board where the plurality of unit regions are separated so as to produce the plurality of individual printed circuit boards; an insulating layer formed so as to cover a surface of the metal core substrate; and a conductive pattern formed on the insulating layer.

15 Claims, 25 Drawing Sheets

(51) Int. Cl.
  *H05K 3/00* (2006.01)
  *H05K 3/46* (2006.01)
  *H05K 3/44* (2006.01)
  *H05K 3/38* (2006.01)
  *H05K 1/11* (2006.01)

(52) U.S. Cl.
  CPC ......... *H05K 3/4608* (2013.01); *H05K 3/4664* (2013.01); *H05K 1/11* (2013.01); *H05K 3/384* (2013.01); *H05K 3/445* (2013.01); *H05K 3/4661* (2013.01)

(56) References Cited

U.S. PATENT DOCUMENTS

| | | | | |
|---|---|---|---|---|
| 7,425,762 | B2* | 9/2008 | Hasebe | H01L 23/142 |
| | | | | 257/707 |
| 8,084,299 | B2* | 12/2011 | Tan | H01L 21/4832 |
| | | | | 257/666 |
| 2003/0168249 | A1* | 9/2003 | Ito | H05K 3/0052 |
| | | | | 174/255 |
| 2004/0072423 | A1* | 4/2004 | Jorne | C25D 3/02 |
| | | | | 438/687 |
| 2004/0238209 | A1* | 12/2004 | Yuri | H05K 1/056 |
| | | | | 174/257 |
| 2014/0264191 | A1* | 9/2014 | Rantala | H01L 31/022425 |
| | | | | 252/513 |
| 2016/0066417 | A1 | 3/2016 | Sugiyama et al. | |

FOREIGN PATENT DOCUMENTS

| | | |
|---|---|---|
| JP | 2012-212951 A | 11/2012 |
| JP | 2016-54222 A | 4/2016 |

\* cited by examiner

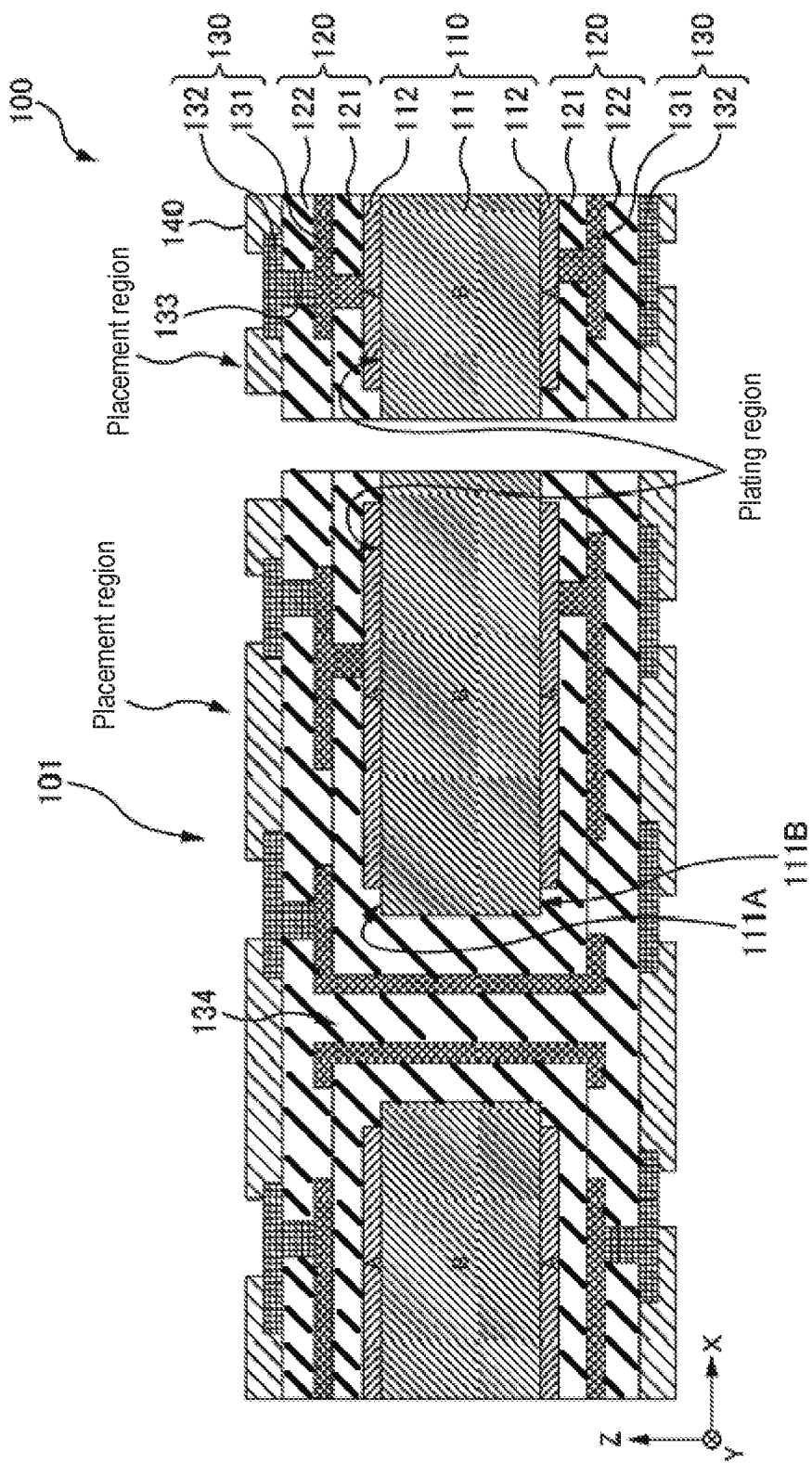

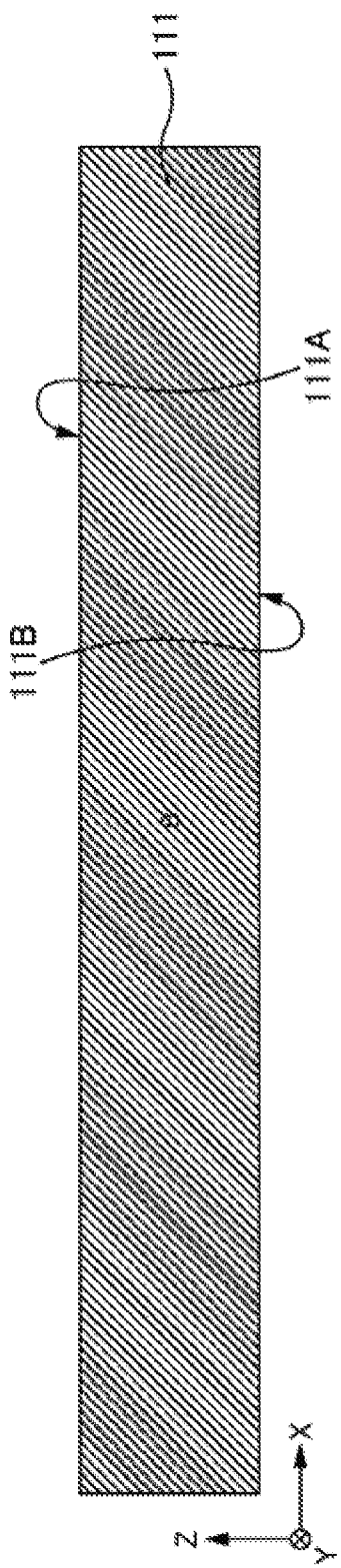

INTERMEDIATE PRINTED BOARD FOR MAKING MULTIPLE PRINTED CIRCUIT BOARDS AND METHOD OF MANUFACTURING THE SAME

BACKGROUND OF THE INVENTION

Technical Field

The present invention relates to an intermediate printed board that has a plurality of unit regions that will be cut out and separated to produce a plurality of individual printed circuit boards.

Background Art

A printed circuit board that has a metal core is well-known, for example (Patent Document 1, for example).

RELATED ART DOCUMENT

Patent Document

Patent Document 1: Japanese Patent Application Laid-Open Publication No. 2012-212951

SUMMARY OF THE INVENTION

Camera modules mounted in high-functionality mobile terminals, such as smartphones, are one of the thickest components of the terminal. In recent years, as the demand for making mobile terminals thinner and more lightweight has increased, demand for making camera modules thinner has grown as well.

Here, it is necessary for there to be a certain distance between the image sensor and the lens; thus, in order to make the camera module thinner, it is necessary to shorten the distance from the top face of the image sensor to the bottom of the printed circuit board. One method of responding to such demands is to make the printed circuit board thinner.

However, when the printed circuit board is made thinner, the rigidity of the printed circuit board decreases; thus, there is concern that the mounting properties of the printed circuit board and the strength as a camera module will be damaged. Meanwhile, when a metal core substrate is made of a strong metallic material in order to ensure the strength of the printed circuit board, such a metallic material often has low thermal conductivity; thus, there is concern that heat generated within the printed circuit board will build up in the interior.

Furthermore, metallic materials with high thermal conductivity (particularly copper, aluminum, and the like) have a tendency to produce burrs during dicing due to the properties of such metallic materials. There has been concern that the formation of burrs will affect the quality of the printed circuit board. Accordingly, the present invention is directed to a scheme that substantially obviates one or more of the problems due to limitations and disadvantages of the related art.

An object of the present invention is to provide a printed circuit board structure that is able to suppress the occurrence of burrs during dicing without lowering the thermal conductivity and strength (rigidity) of the printed circuit board.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides an intermediate printed board having a plurality of unit regions that are to be cut out and separated to become a plurality of individual printed circuit boards, respectively, the intermediate printed board including: a metal core substrate including: a metal layer; and a plating layer formed on each of a top surface and a bottom surface of the metal layer, the plating layer being absent in each of cutting regions, the cutting regions being regions on the intermediate printed board where the plurality of unit regions are separated so as to produce the plurality of individual printed circuit boards; an insulating layer formed so as to cover a surface of the metal core substrate; and a conductive pattern formed on the insulating layer.

In another aspect, the present disclosure provides a method for manufacturing printed circuit boards, including: preparing an intermediate printed board having a plurality of unit regions that are to be cut out and separated to become a plurality of individual printed circuit boards, respectively, the intermediate printed board including: a metal core substrate including: a metal layer; and a plating layer formed on each of a top surface and a bottom surface of the metal layer, the plating layer being absent in each of cutting regions, the cutting regions being regions on the intermediate printed board where the plurality of unit regions are separated so as to produce the plurality of individual printed circuit boards; an insulating layer formed so as to cover a surface of the metal core substrate; and a conductive pattern formed on the insulating layer; and mechanically cutting the intermediate printed board at the cutting regions so as to cut out and separate the plurality of unit regions into the plurality of individual printed circuit boards.

Additionally, the problems and resolution means disclosed in the present application are clarified using the descriptions in the Detailed Description of Embodiments section, the description of the drawings, and the like.

According to the present invention, it is possible to obtain an intermediate printed board that is unlikely to generate burrs during dicing while maintaining the strength of the intermediate printed board even if the intermediate printed board is thin.

It is to be understood that both the foregoing general description and the following detailed description are exemplary and explanatory, and are intended to provide further explanation of the invention as claimed.

BRIEF DESCRIPTION OF THE DRAWINGS

FIG. 1C is a cross-sectional view that shows a schematic of when the intermediate printed board shown in FIG. 1A has been diced.

FIG. 5A is a view that describes a method of manufacturing the intermediate printed board according to the embodiment shown in FIG. 1A.

DETAILED DESCRIPTION OF EMBODIMENTS

Figure 1A:
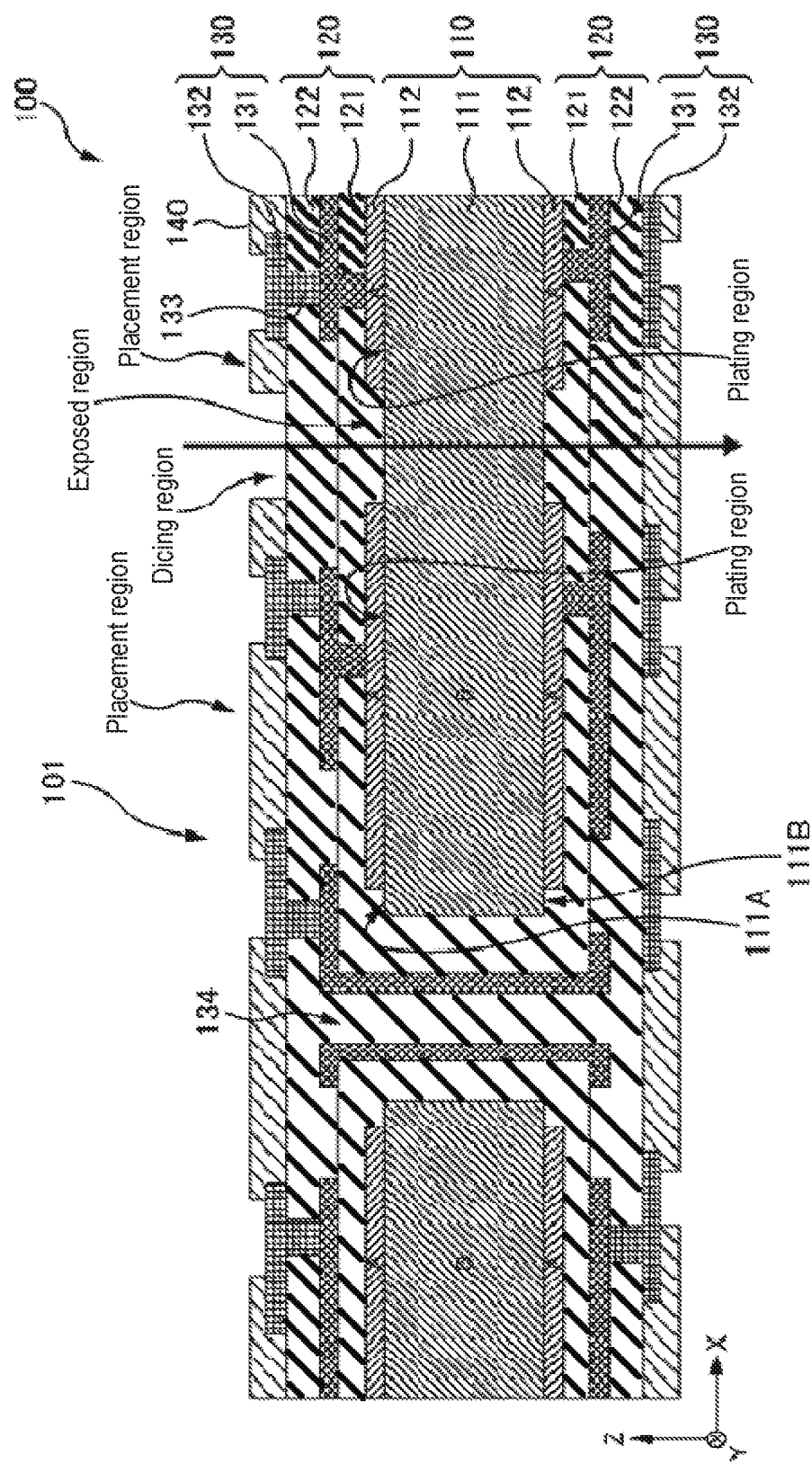
FIG. 1A is a cross-sectional view that schematically shows an intermediate printed board according to an embodiment of the present invention.

An intermediate printed board 100 according to an embodiment of the present invention will be described below while referencing the drawings as appropriate. Here, the intermediate printed board 100 will described as a printed board preferably used as an intermediate printed board 100 for a camera module. For example, there is demand for an optical module that does not deform and has superior flatness since such a module will be handling light. This is because, with such a module, adjusting the optical path through which light is received and emitted, or the like, is easy, improving versatility of such a module. In particular, there is demand for flatness for twin-lens camera modules, which have recently been in the spotlight for mobile phones, since two imaging elements are adjacently disposed on the same substrate. Thus, there is demand for the mounting substrate itself to be rigid. Currently, in a case in which a plurality of imaging elements are respectively arranged on one chip, there is demand for the substrate to be flat and demand that the flatness not change as a result of heat or the like. Furthermore, for wafers, even in instances in the future in which a plurality of imaging elements are cut and provided as one chip, there will be demand for rigidity and flatness since the chip itself will be larger. Regardless, one metal core substrate 110 that is able to support this plurality of imaging elements is required. In such a case, a Cu substrate, Fe substrate, or SUS substrate is preferable.

Rigidity refers to the degree of difficulty in changing the dimensions (deforming) in response to bending and twisting forces or increases/decreases in temperature. With this in mind, high rigidity means that the ability for a flat substrate to remain flat is high. Put another way, rigidity indicates the degree of difficulty in changing the dimensions (deforming) in response to bending and twisting forces. In other words, high rigidity indicates a superior ability for a flat substrate to remain flat.

However, the intermediate printed board 100 of the present invention can be applied to something other than a camera module. Note that constituting components that are common or similar in the drawings are assigned the same or similar reference characters.

===Intermediate Printed Board 100 According to the Present Embodiment===

The intermediate printed board 100 of the present embodiment will be described with reference to FIGS. 1A to 1D, FIG. 2, FIGS. 3A to 3B, FIG. 4, FIGS. 5A to 5J, FIG. 10A, and FIG. 10B.

Here, in FIGS. 1A to 1D, FIG. 2, FIG. 3A to 3B, FIG. 4, and FIGS. 5A to 5J, a thickness direction of a printed circuit board 101 is defined as the Z direction, a direction moving inward from the front of the paper surface of the drawing in a plane orthogonal to the Z axis is set as the Y direction, and a direction orthogonal to the Y axis and the Z axis is set as the X direction.

<<Configuration of Intermediate Printed Board 100>>

The intermediate printed board 100 is a board in which a plurality of printed circuit boards 101 have been connected. The connected plurality of printed circuit boards 101 are divided into individual printed circuit boards 101 by dicing the intermediate printed board 100. Here, on the intermediate printed board 100, regions on which electronic components are provided are set as placement regions, and a space between the adjacent placement regions is set as a dicing region.

Figure 10A:
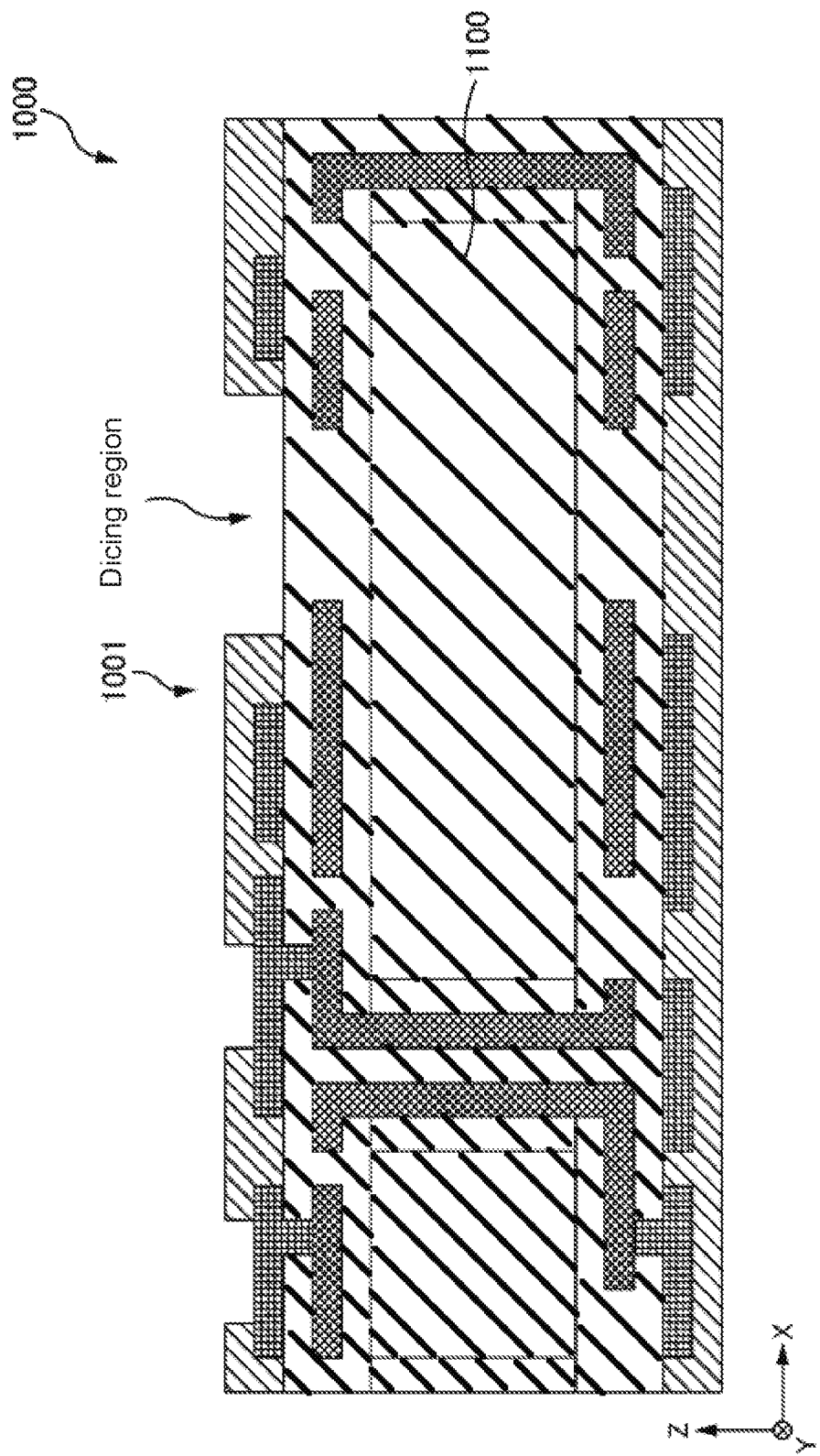
FIG. 10A is a cross-sectional view that schematically shows an intermediate printed board that does not have a plating layer.
Figure 10B:
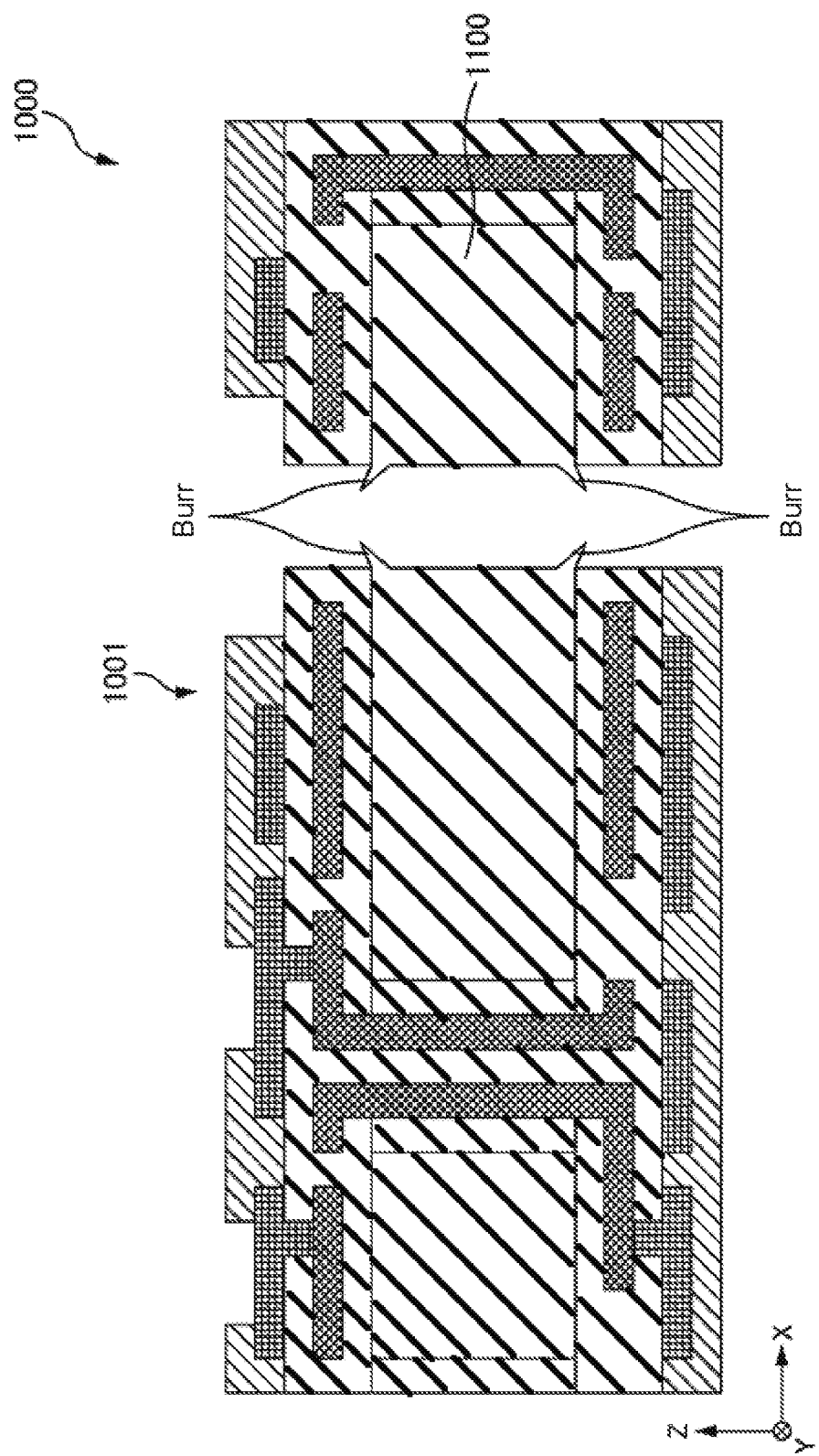
FIG. 10B is a cross-sectional view showing a state in which burrs occur during dicing in the intermediate printed board that does not have a plating layer.

Here, when a conventional intermediate printed board 1000 is diced as shown in FIG. 10A, burrs occur at the ends of printed circuit boards 1001, as shown in FIG. 10B. In order to increase electric conductivity and thermal conductivity for the printed circuit board 1001, copper is used in a metal core substrate 1100. However, metallic materials such as copper that have high electric conductivity and thermal conductivity are likely, as mentioned above, to have burrs when diced due to the properties of the material. Here, it is possible to use a metallic material that is unlikely to develop burrs during dicing in the metal core substrate 1100; however, such a metallic material will have low electric conductivity and thermal conductivity. Therefore, the intermediate printed board 100 according to the present embodiment has a structure that makes burrs unlikely to occur during dicing without decreasing rigidity, electric conductivity, and thermal conductance.

As shown in FIGS. 1A and 1C, such an intermediate printed board 100 is configured to include at least: a metal core substrate 110; insulating layers 120; a conductive pattern 130; and a solder resist layer 140.

The metal core substrate 110 is a plate-shaped member made from a plurality of metallic materials, as will be mentioned later, and imparts rigidity to the printed circuit board 101. In addition, the metal core substrate 110 is used as a ground or ground electrode, for example. The thickness of the metal core substrate 110 is less than or equal to 250 µm, for example, and may be 210 µm, 160 µm, or 120 µm.

The metal core substrate 110 includes: a metal layer 111 formed so as to include a first metallic material; and plating layers 112 that are formed on the metal layer 111 and made of a second metallic material that is different from the first metallic material. Here, in the metal layer 111, a region that corresponds to a placement region of the intermediate printed board 100 is called a plating region, and a region corresponding to a dicing region of the intermediate printed board 100 is called an exposed region.

The plating layers 112 are respectively formed on a first primary surface 111A on the upper side (+Z direction side) on the paper (drawing) of the plating region of the metal layer 111, and on a second primary surface 111B on the lower side (−Z direction side) on the paper (drawing). The plating layers 112 are not formed on the exposed region (dicing line region or cutting region) of the metal layer 111. As a result, when the intermediate printed board 100 is diced, the section on which the plating layers 112 are provided is not diced; thus, burrs will not occur in the plating layers 112. It is preferable that the plating layers 112 be greater than or equal to 50 µm inward from the dicing region on the printed circuit board 101 when dicing is performed.

In addition, it is preferable that the plating layers 112 have a polycrystalline structure such that surface irregularities are formed on the surface of the plating layers 112. As a result, adhesion between the plating layers 112 and the insulating layers 120 stacked on the plating layers 112 increases. Increasing the adhesion between the plating layers 112 and the insulating layers 120 will be described in more detail below.

The first metallic material forming the metal layer 111 is stainless steel, for example, and the second metallic material forming the plating layers 112 is copper, for example. By covering the metal layer 111 with a metal (the plating layers 112) that has better electric conductivity and better thermal conductivity than the metal layer 111, it is possible to produce the intermediate printed board 100 without decreasing the rigidity of the intermediate printed board 100 or decreasing the electric conductivity and thermal conductivity. In addition, since the second metallic material forming the plating layers 112 is a metallic material identical to a conductive material in a via 133 or the like, it is possible to increase connection reliability. Due to the metal layer 111 having such a configuration, the printed circuit board 101 created by dicing the intermediate printed board 100 has stronger rigidity compared to a metal core substrate made of only the second metallic material; thus, it is possible to maintain flatness. Furthermore, since the electric conductivity and thermal conductivity are high, the metal core substrate 110 is able to improve the function as a ground and the function as a heat-dissipating member compared to a metal core substrate formed of only the first metallic material.

Here, stainless steel is alloy steel in which iron (Fe) is the chief component (greater than or equal to 50 wt %) and which contains greater than or equal to 10.5 wt % chromium (Cr), for example. In addition, stainless steel can be referred to as stainless steel, stainless, stain, and the like. Also, in accordance with the metallic structure, stainless steel can be chiefly classified into one of the following five categories: martensite stainless steel; ferrite stainless steel; austenite stainless steel; austenite-ferrite two-phase stainless steel; and precipitation-hardened stainless steel. Furthermore, in regards to Vicker's hardness (unit: HV), martensite stainless steel has a value of 615, ferrite stainless steel has a value of 183, austenite stainless steel has a value of 187, and precipitation-hardened stainless steel has a value of 375, each of which represents a higher hardness than that of copper.

Note that there are metallic materials that are harder than stainless steel, which is used as the first metallic material; however, compared to these other metallic materials, stainless steel is easier to acquire, easier to process, and costs less; thus, stainless steel is the one of the most preferable metallic materials to use. In other words, stainless steel is preferable as the first metallic material. All of the embodiments below will be described using stainless steel as the first metallic material.

The planar structure of the intermediate printed board 100 will be described using FIG. 1D. In FIG. 1D, the metal core substrate 110 formed of stainless steel and Cu plating is provided on substantially the entire intermediate printed board 100. The four rectangles shown using dashed lines are sections that will become the printed circuit boards (unit boards) 101, and are disposed in a vertical/horizontal (X direction and Y direction) matrix. Also, dicing lines are formed in a grid pattern between two adjacent unit boards 101, and the regions defined by the solid lines in the vertical and horizontal directions (X direction and Y direction) are dicing line regions (cutting regions) that extend in the vertical and horizontal directions. The vertical/horizontal (X direction and Y direction) dicing lines shown by a dotted-dashed line are sections in which the center of a blade (not shown) of a dicing apparatus (not shown) passes through. When the blade width is set narrower than the width of the dicing line region, it is possible to perform dicing without cutting the plating layer 112 by using a blade to grind the exposed region of the first metallic material where the plating layer 112 has been removed. Here, since the first metallic material exists across the entire dicing region, the blade will normally grind the first metallic material.

Next, an intermediate printed board 100 having a different structure will be described using FIG. 1B. The four rectangles shown using dashed lines are sections that will become the unit boards 101, and are disposed in a vertical/ horizontal (X direction and Y direction) matrix. In addition, bridges 102 are disposed between two adjacent unit boards 101. Here, two bridges 102 are provided so as to connect opposing sides of two unit boards to each other. As mentioned above, the dicing lines are formed in a grid pattern, and the regions defined by the solid lines in the vertical and horizontal directions (X direction and Y direction) are dicing line regions that extend in the vertical and horizontal directions. The vertical/horizontal (X direction and Y direction) dicing lines shown by the dotted-dashed line are sections in which the center of a blade of a dicing apparatus passes through. If the blade width is set narrower than the width of the dicing line region, an exposed region in which the plating layer 112 has been removed and the first metallic material is exposed is formed on the bridge, and the blade is able to perform dicing without cutting the plating 112. Note that, here, unlike in FIG. 1D, a slit is formed between the bridges, greatly reducing the amount of the first metallic material that is ground.

Figure 1B:
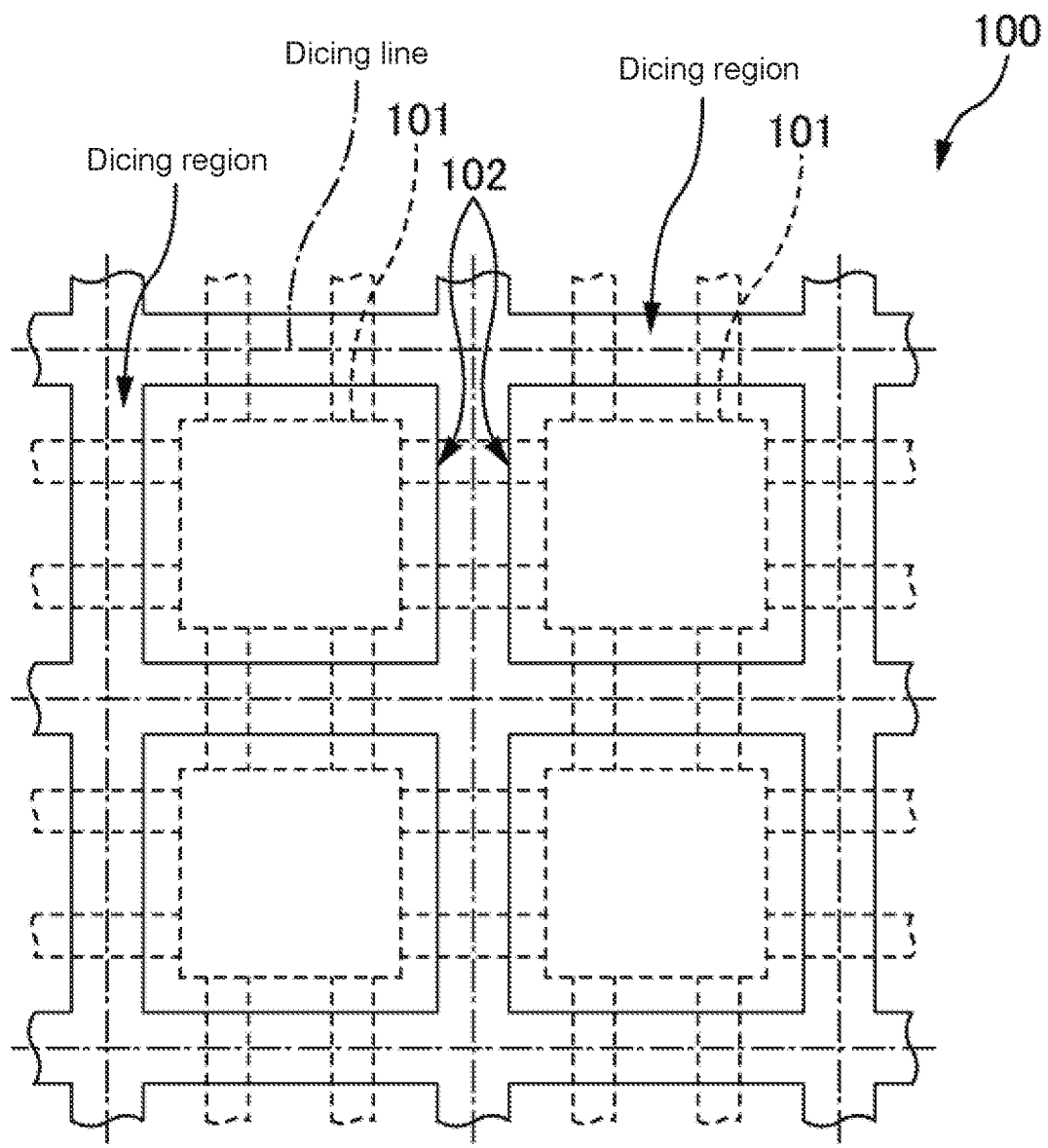
FIG. 1B is a plan view that schematically shows an intermediate printed board according to the embodiment.
Figure 1D:
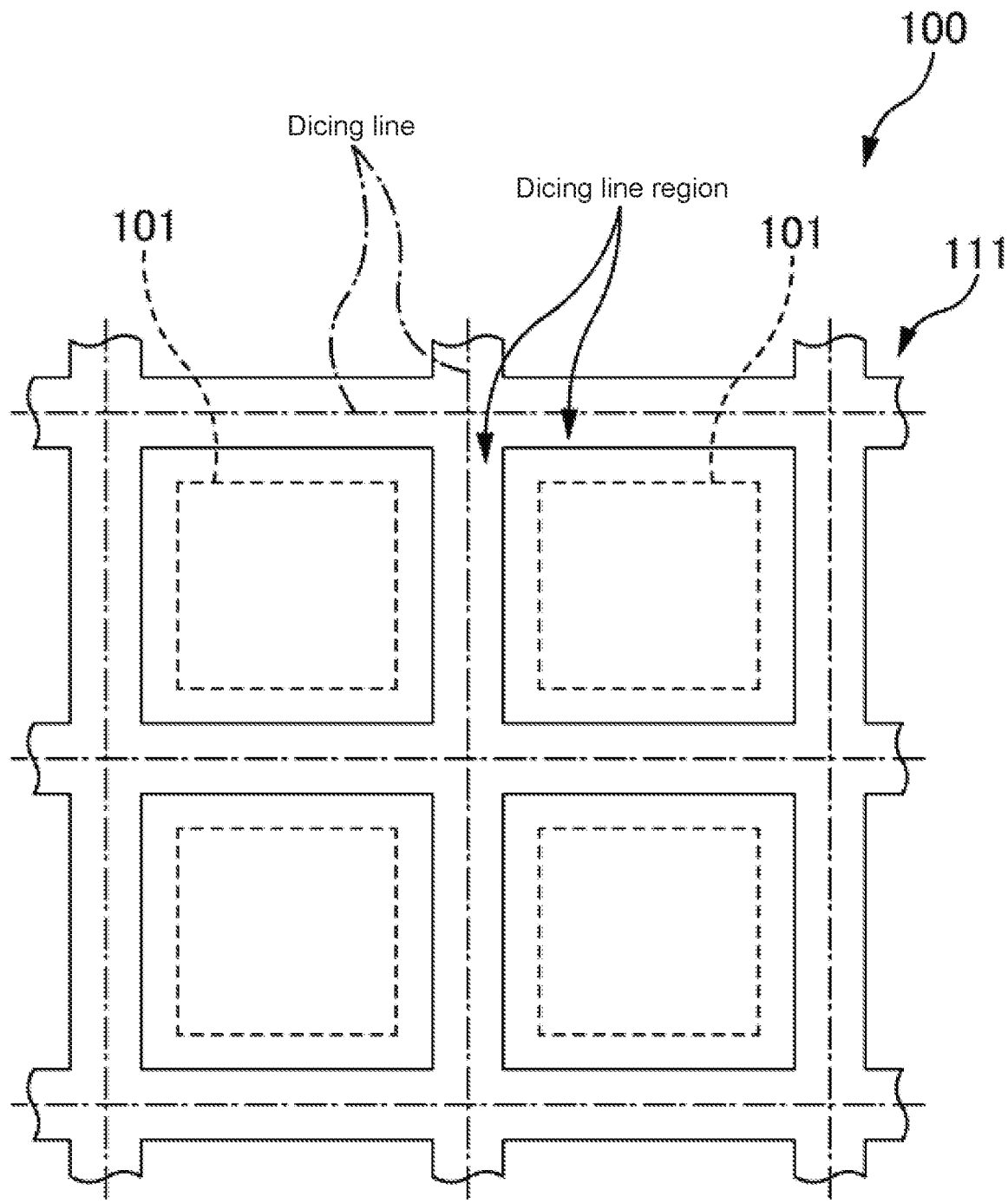
FIG. 1D is a plan view that schematically shows an intermediate printed board according to the embodiment.

Regardless of whether the structure in FIG. 1B or FIG. 1D is used, the exposed region, as shown in FIG. 1C, is formed so as to be wide (the width is formed wide) and to be slightly inward of the region ground by the blade; thus, the blade does not grind the plating layer 112.

Figure 2:
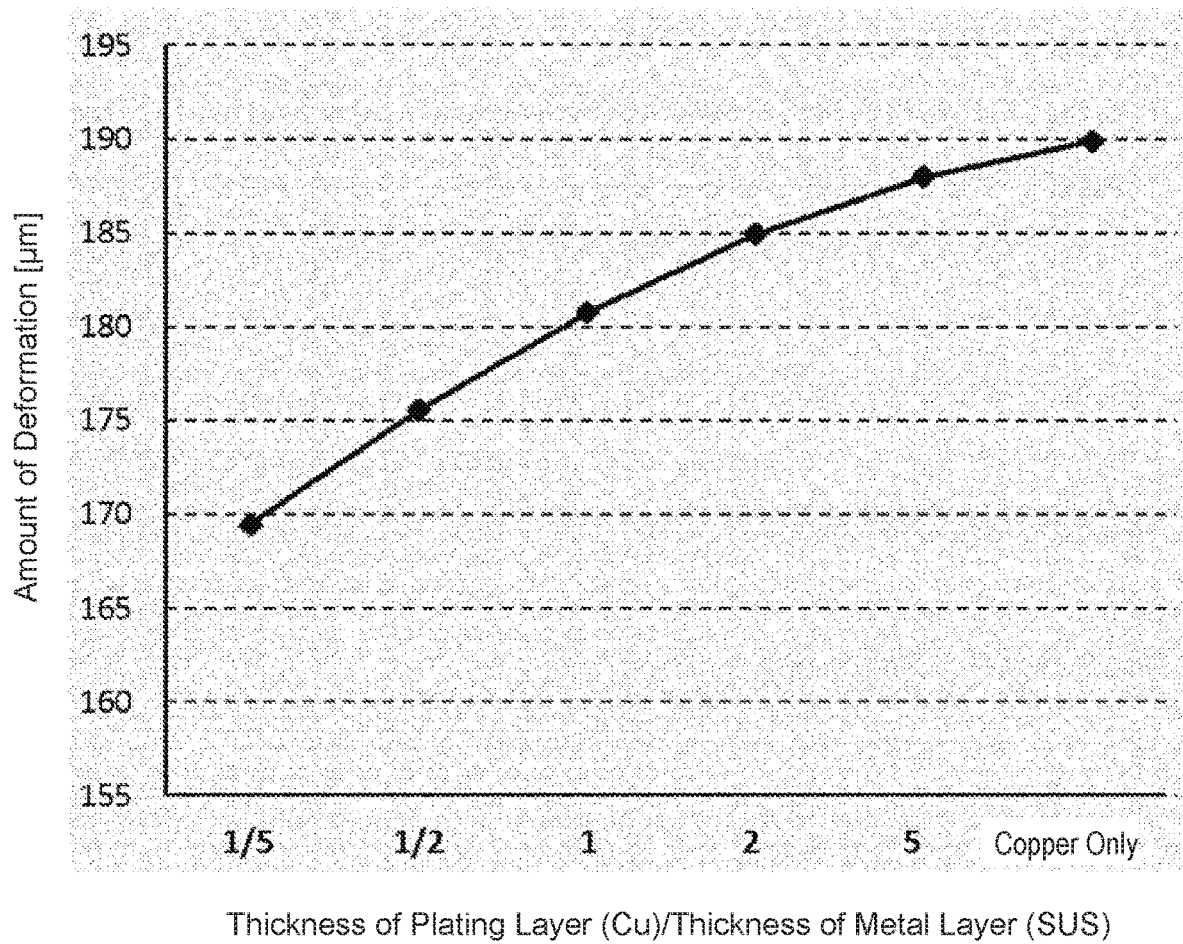
FIG. 2 is a graph that shows a relationship between an amount of deformation of a printed circuit board and a ratio between thicknesses of a metal layer and a plating layer that form the metal core substrate.

Here, the thicknesses of the metal layer 111 and the plating layer 112 will be described while referring to FIG. 2. FIG. 2 shows a relationship between an amount of deformation of the printed circuit board 101 and a ratio between thicknesses of the plating layer 112 (copper) and the metal layer 111 (stainless steel) in a rectangular printed circuit board 101 that is formed so as to include a 120 µm metal core substrate 110 and has dimensions of 17.8 mm×8.5 mm. The horizontal axis of the graph shown in FIG. 2 represents the ratio of the thickness of the plating layer 112 with respect to the thickness of the metal layer 111, and the vertical axis of the graph represents the amount of deformation of the printed circuit board 101. As shown in FIG. 2, it can be seen that as the ratio of the metal layer 111, in which the modulus of elasticity is relatively high, increases, or in other words, as the ratio of the plating layer 112, in which the modulus of elasticity is relatively small, decreases, the amount of deformation of the printed circuit board 101 decreases. In other words, it can be seen that the rigidity of the printed circuit board 101 increases.

Therefore, it is preferable that the thickness of the plating layers 112 be formed thinner than the thickness of the metal layer 111 in the intermediate printed board according to the present embodiment. For example, when the thickness of the metal core substrate 110 is 120 µm, it is preferable that the thickness of the metal layer 111 be thicker than 60 µm and that the thickness of the plating layers 112 be thinner than 60 µm. In other words, it is preferable that a thickness TA of a metal A and a thickness TB of a metal B satisfy the relationship 2 TA/TB<1. By using such a metal core substrate 110, it is possible to increase the rigidity of the printed circuit board 101 compared to a board that has the same thickness and is formed of only the second metallic material. Furthermore, if at least TA/TB<1 is empirically satisfied, the function of the printed circuit board 101 will not be affected; thus, such a thickness relationship may also be used.

The preferred combination of the first metallic material and the second metallic material is the above-mentioned combination of stainless steel and copper; however, the present invention is not limited to this. Specifically, a combination of other metallic materials that satisfies the conditions mentioned below, such as a combination of "aluminum" and either "iron" or "nickel," for example, may be used. However, it is preferable that the first metallic material and the second metallic material be metals that are unlikely to diffuse.

In addition, the electric conductivity of the plating layers 112 is higher than the electric conductivity of the metal layer 111, and the thermal conductivity of the plating layers 112 is higher than the thermal conductivity of the metal layer 111. As mentioned above, the combination of the first metallic material and the second metallic material satisfies this relationship. Alternatively, only one of the electric conductivity and the thermal conductivity of the plating layer 112 may be higher than the corresponding physical value of the metal layer 111.

In addition, the metal core substrate 110 may have a metal interposing layer (not shown) as an intermediary metal between the metal layer 111 and the plating layer 112. As a result, the adhesion between the metal layer 111 and the plating layer 112 will increase. A third metallic material included in the metal interposing layer is at least one material selected from among nickel, palladium, titanium, tungsten, chromium, cobalt, and tin, for example. In addition, the third metallic material may, like tin, for example, be diffused in the first metallic material and the second metallic material.

In the present embodiment, the metal interposing layer is a thin film of less than 1 µm, and thus has very little effect on the mechanical properties of the metal core substrate 110. In addition, two or more of the above-mentioned metallic materials may be selected as the third metallic material.

The insulating layer 120 is formed on the surface of the metal core substrate 110. The insulating layer 120 is formed of an epoxy resin, a polyimide or bismaleimide triazine resin, and the like, for example. Glass fibers are provided within these resins. In addition, these resins may contain a filler such as aluminum oxide or silica dioxide in place of the glass fibers. Furthermore, the glass fibers and the filler may be mixed together. These resins are generally referred to as thermosetting synthetic resins.

Note that, while, as shown in FIGS. 1A and 1C, the insulating layer 120 is formed of two layers of a first insulating layer 121 and a second insulating layer 122, the number of layers in the insulating layer 120 may be appropriately modified.

The conductive pattern 130 is formed on the insulating layer 120, and is insulation-treated. It is preferable that the material of the conductive pattern 130 be the second metallic material or a material with mechanical properties similar to the second metallic material. For example, when the plating layers 112 are formed so as to include copper, the optimal material for the conductive pattern 130 is copper. The conductive patterns 130 are formed on the printed board 101 in sections that do not overlap the exposed regions in a plan view, for example, so that dicing can be easily performed and burrs will not occur.

Note that, as shown in FIGS. 1A and 1C, the conductive pattern 130 is shown to include two layers, which are a first conductive pattern 131 and a second conductive pattern 132; however, the number of layers included in the conductive pattern 130 may be appropriately modified.

As clearly shown using a manufacturing method that will be mentioned later, when the first conductive pattern 131 is formed of copper, the plating layers 112, which are copper or have copper as the primary material, are respectively formed on both surfaces of the metal layer 111. GND wiring of the first conductive pattern 131 is then mechanically and electrically connected to the plating layer 112 by means of through-holes or via. In other words, the first conductive pattern 131 is a so-called substrate ground.

The solder resist layer 140 is an insulating film that protects a circuit pattern formed on the printed circuit board 101, and is formed on the surface of the insulating layer 120. The solder resist layer 140 is formed of a thermosetting epoxy resin, for example. Note that, in order to make dicing easier, it is preferable that the solder resist layer 140, on one surface of the printed board 101, that corresponds to the exposed region of the metal layer 111 has been removed. Meanwhile, so as to be able to stably place the intermediate printed board 100 during dicing, it is preferable that the solder resist layer 140 on the other surface of the printed board 101 has not been removed.

Note that, while the printed circuit board 101 does not include built-in components in the present embodiment, the printed circuit board 101 may include built-in components.

<<Increasing Rigidity by Improving Adhesion Between Plating Layer 112 and Insulating Layer 120>>

Increasing the rigidity of the printed circuit board 101 by improving the adhesion between the plating layer 112 and the insulating layer 120 will be described with reference to FIGS. 3A and 3B.

In the plating layer 112, the crystal structure is small and has a polycrystalline structure. In addition, in order to grow in the Z direction, the plating layer 112 has a pillar structure. Thus, the surface of the plating layer 112 is a finely-roughened surface that is highly adhesive. Furthermore, since the plating layer 112 has a polycrystalline structure, the grain boundary is further etched during etching, and it is possibly to further increase the roughness of the plating layer 112.

In addition, by filling the insulating layer 120 with a filler, it is possible to further increase the rigidity of the printed circuit board 101. A filler is a filling material having a grain shape, crushed shape, short fiber shape (needle shape), or woven fiber sheet shape. When the filler is mixed into a resin, the rigidity of the printed circuit board 101 increases. The grain-shaped, crushed-shape, or short-fiber-shaped filling material is a silicon oxide film, aluminum oxide, needle-shaped glass fibers, needle-shaped carbon, or graphite fibers, for example.

Figure 3A:
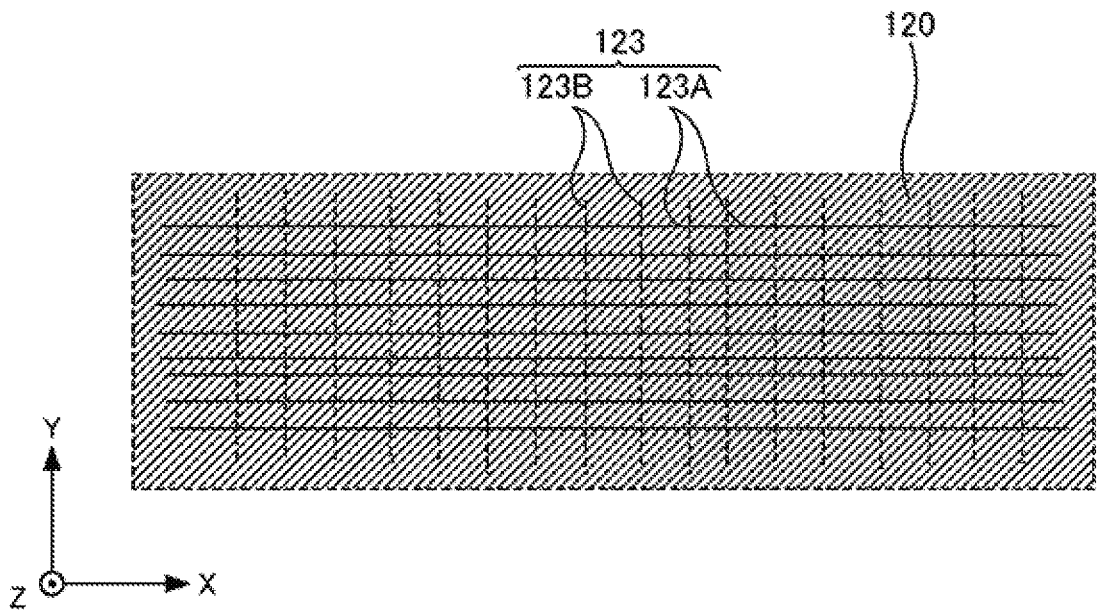
FIGS. 3A and 3B are schematic diagrams in which a reinforcing fiber sheet is provided on an insulating layer of the intermediate printed board according to the embodiment.
Figure 3B:
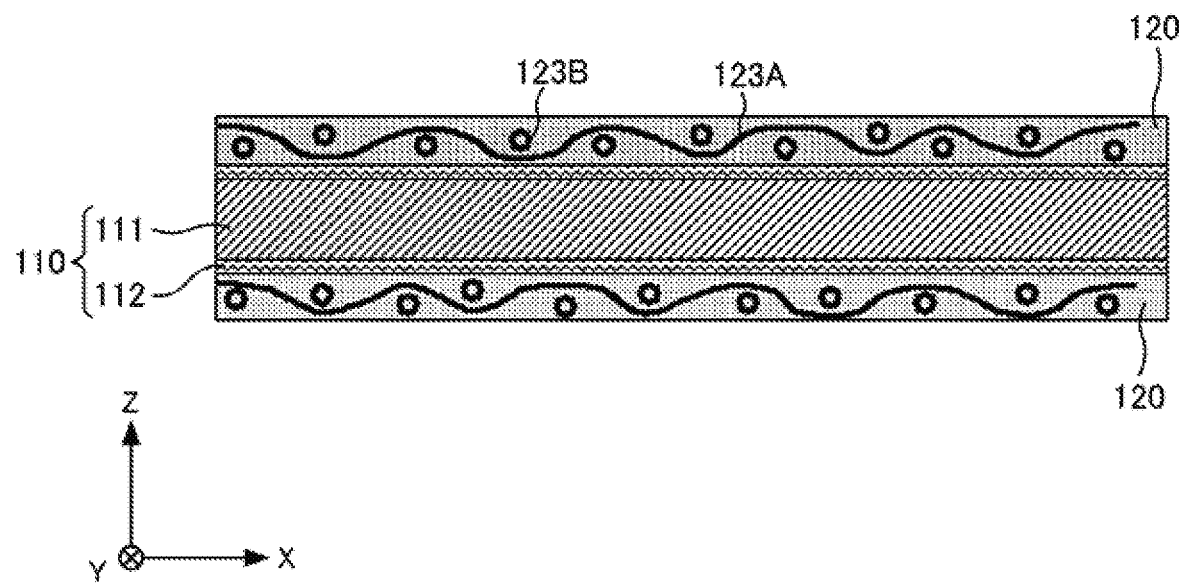

In addition, as shown in FIG. 3A and FIG. 3B, a reinforcing fiber sheet 123 used for reinforcing and woven from reinforced fibers such as carbon fibers or glass fibers, may be provided on the insulating layer 120 in place of the above-mentioned filler. The reinforcing fiber sheet 123 is thinly woven like a cloth in two dimensions (a plane shape) on the plating layer 112. In the reinforcing fiber sheet 123, reinforcing fibers 123A provided in the horizontal direction (X direction) on the paper (drawing) and reinforcing fibers 123B provided in the vertical direction (Y direction) on the paper (drawing) surface are arranged in plurality, and woven so as to be alternately sewn, for example. Since this sheet is integrally fixed with the resin of the insulating layer 120, and furthermore, since the insulating layer adheres to the surface irregularities of the plating layer 112 via an anchor effect, the rigidity of the printed circuit board increases. Note that it is possible to further increase the rigidity by using reinforced fibers of carbon or the like in place of the glass reinforcing fiber sheet 123.

<<Improving Contact Between Metal Layer 111 and Via 133>>

Figure 4:
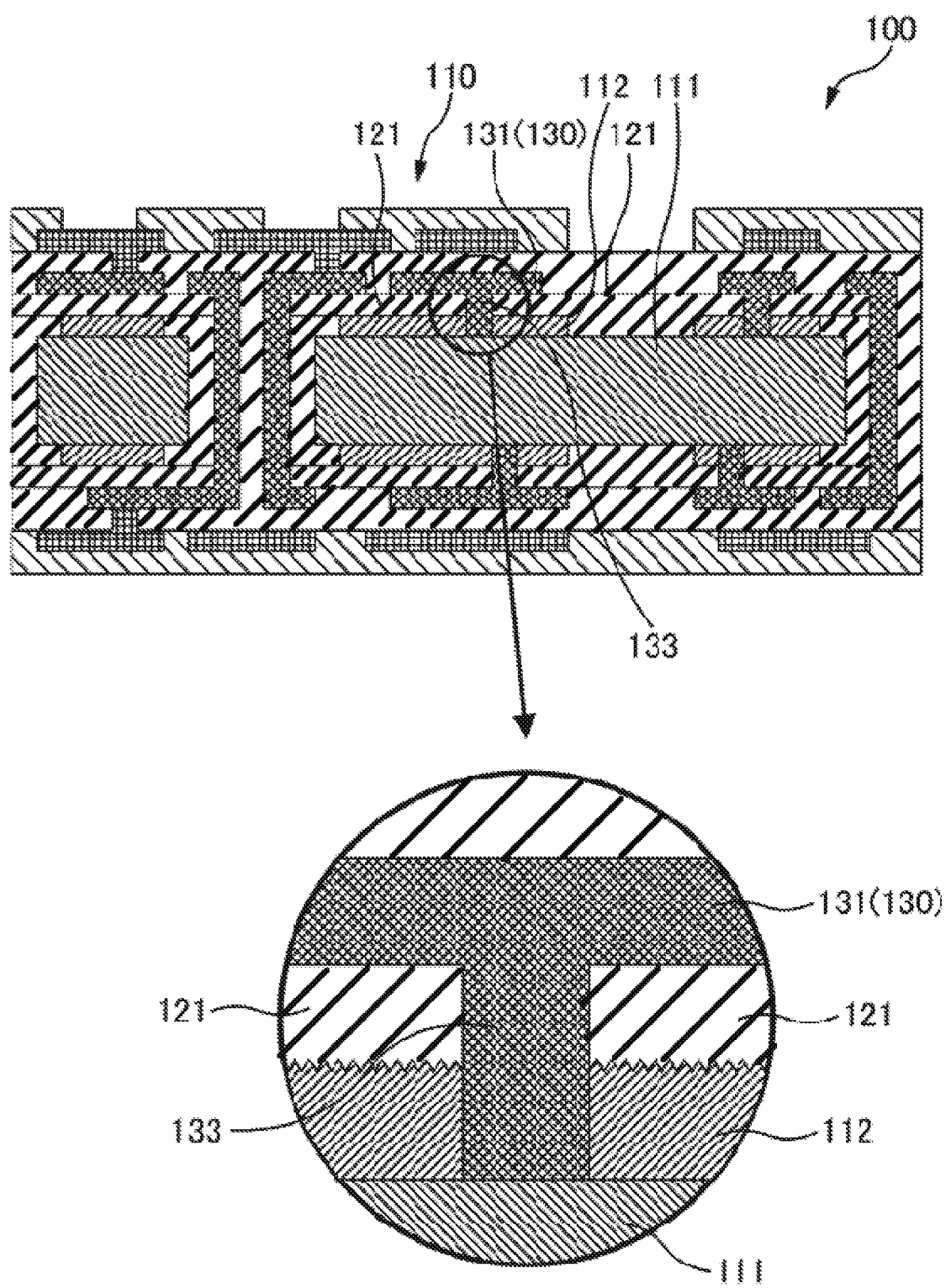
FIG. 4 is a schematic diagram that describes adhesion between the insulating layer and the plating layer of the intermediate printed board according to the embodiment.

In addition, as shown in FIG. 4, in a case in which the conductive pattern 130 is connected to the metal core substrate 110 by means of the via 133, by improving the contact between the via 133 and the metal core substrate 110, it is possible to improve the rigidity of the printed circuit board 101 and the low resistance of the contacting sections. Generally, when forming the via 133, the insulating layer 120 is cured and processing for forming the via 133 is performed using laser processing and an etching fluid, and once these steps have been completed, an oxidized film is formed on the surface of the metal layer 111. As a result of an oxidized film formed in such a manner, when the via 133 is plated, the characteristics of the printed circuit board 101 are affected, such as increases in the resistance value and fluctuation in the resistance value due to ion migration or the like, and the rigidity of the printed circuit board 101 is also affected.

In order to alleviate this, as shown in FIG. 4, the intermediate printed circuit board 100 may have a structure that exposes the metal layer 111 by removing the plating layer 112 in the via 133 to form the via 133 there. A crystalline structure that flatly extends in the XY plane is exposed at the bottom (the surface of the metal layer 111) of the via 133. As a result, ions and water are unlikely to become trapped; thus, it is possible to achieve satisfactory adhesion since the formation of an oxidized film can be prevented.

When applying the printed circuit board 101 produced from the intermediate printed board 100 according to the present embodiment to a camera module, an imaging element is mounted on the printed circuit board 101 as a semiconductor element. Furthermore, a lens unit, an actuator for auto-focus, a filter unit, and an optical package that fixedly disposes the lens unit, actuator, and filter unit, are disposed around the imaging element. In addition, there are high resolution devices in which a plurality of camera modules are disposed. When the printed circuit board 101 according to the present embodiment is used, it is easy to optically adjust the device since rigidity is high and the printed circuit board 101 is very flat. In addition, since this printed circuit board 101 is difficult to break unlike a printed circuit board 101 in which the core substrate is made of a ceramic, workability also improves.

<<Manufacturing Process of Intermediate Printed Board 100>>

The manufacturing process of the intermediate printed board 100 will be described below with reference to FIGS. 1C and 5A to 5J.

First, as shown in FIG. 5A, the metal layer 111 is prepared in order to form the metal core substrate 110. When the printed circuit board 101 includes built-in components, upon holes being formed in the metal layer 111 and built-in components being inserted in these holes, the holes are sealed via a resin.

Figure 5B:
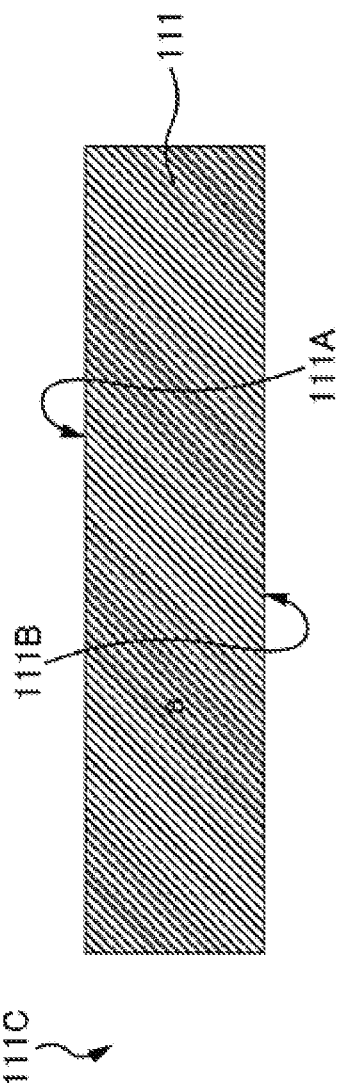
FIG. 5B is a view that describes the method of manufacturing the intermediate printed board according to the embodiment shown in FIG. 1A.
Figure 5C:
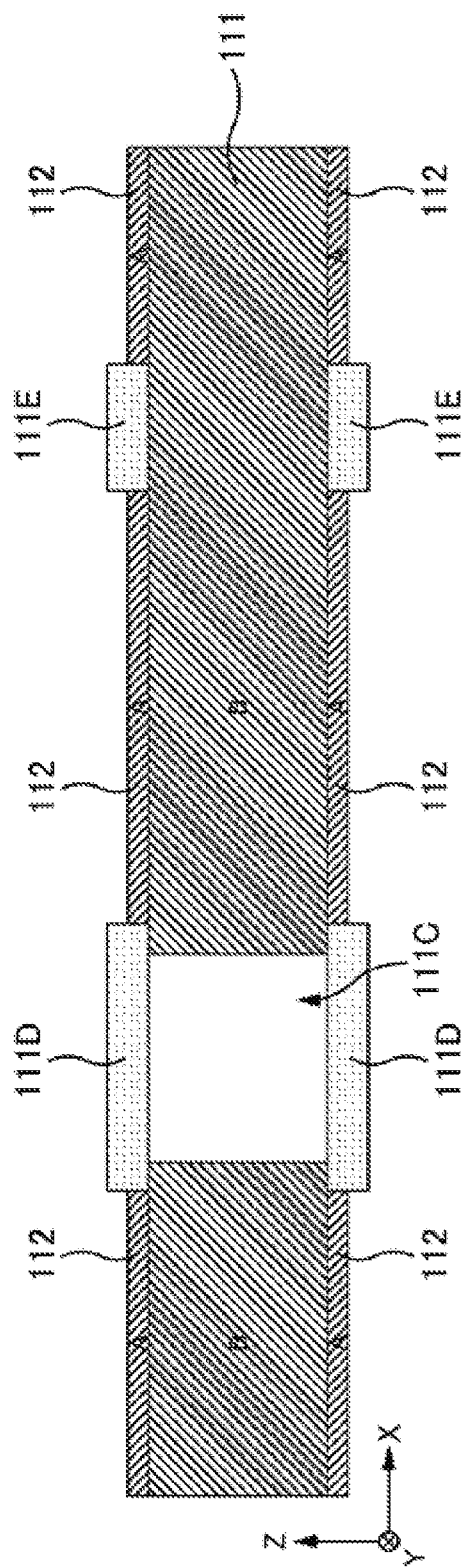
FIG. 5C is a view that describes the method of manufacturing the intermediate printed board according to the embodiment shown in FIG. 1A.
Figure 5D:
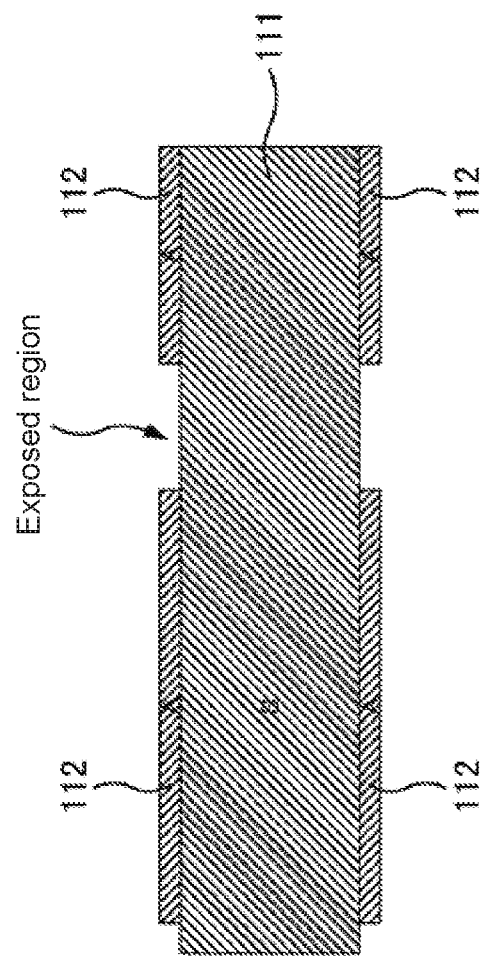
FIG. 5D is a view that describes the method of manufacturing the intermediate printed board according to the embodiment shown in FIG. 1A.
Figure 5D:
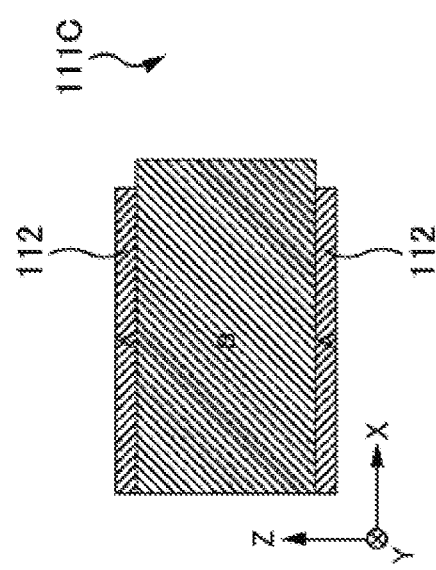

Next, as shown in FIG. 5B, a penetrating hole 111C is formed in a section that corresponds to a through-hole of a circuit board. This penetrating hole 111C is formed using etching, laser processing, mechanical processing such as punching, or the like. Next, as shown in FIG. 5C, resin sheets 111D, 111E for plating are formed and patterned. Here, the resin sheets are pattered so as to cover the penetrating hole 111C and also such that the resin sheet 111E is disposed on a section corresponding to the dicing lines. This is possible via photoetching. Thereafter, the board is inserted into a plating solution, forming the plating layers 112. Thereafter, when the resin sheets 111D, 111E are removed, exposed regions are formed on sections that correspond to the dicing line regions without the plating layers 112 being formed on those sections. In addition, the plating layers 112 are formed in the placement region sections (see FIG. 5D). Note that, as shown in FIG. 5I, the plating layers 112 may be formed on the entirety of both surfaces of the metal layer 111, and thereafter, as shown in FIG. 5J, after the plating layers 112 have been removed from sections corresponding to the penetrating hole 111C and the exposed regions, a through-hole H may be formed using mechanical processing or laser processing.

Figure 5E:
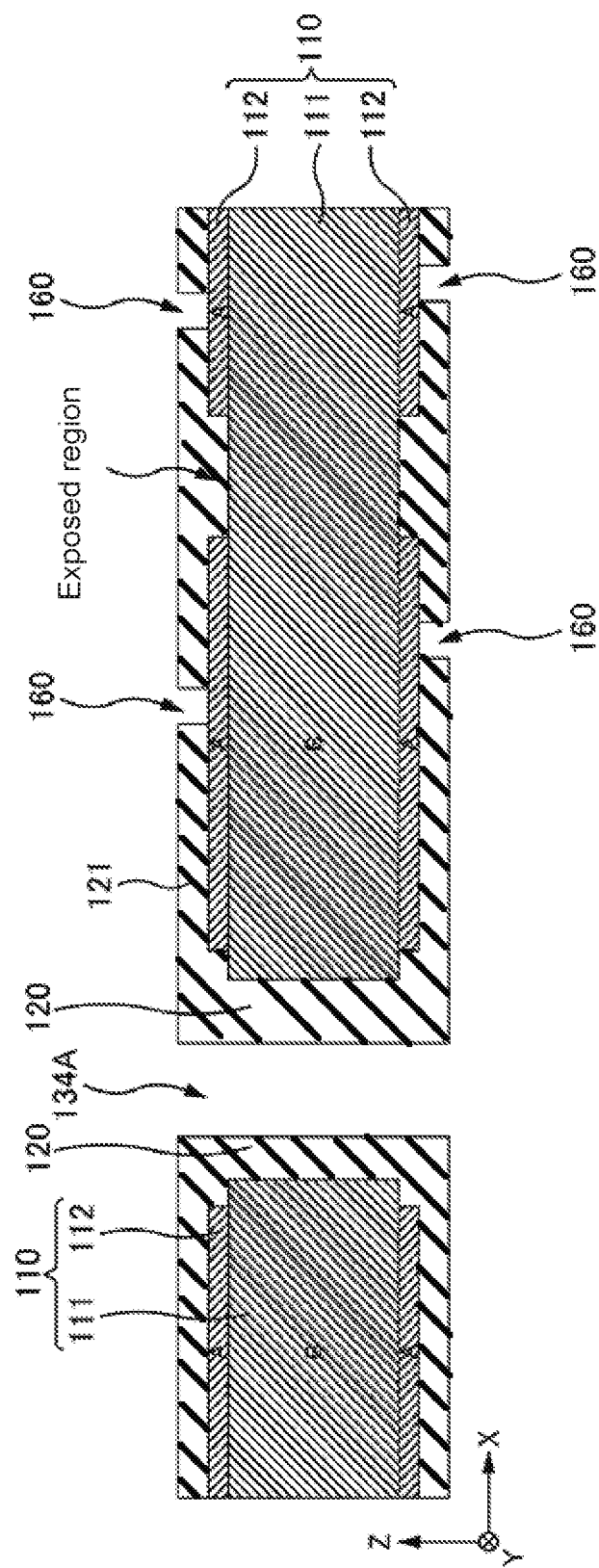
FIG. 5E is a view that describes the method of manufacturing the intermediate printed board according to the embodiment shown in FIG. 1A.

Next, as shown in FIG. 5E, the first insulating layer 121 is formed over the surface of the metal layer 111 that has the plating layers 112 thereon, and holes 160 and a through-hole 134 (see FIG. 5F) are formed in the first insulating layer 121 via etching or laser processing, for example. The holes 160 are holes for contacting the metal layer, and the through-hole 134 is a hole that is smaller than the through-hole 134A and that is covered on the inner walls by the insulating layer 120.

Figure 5F:
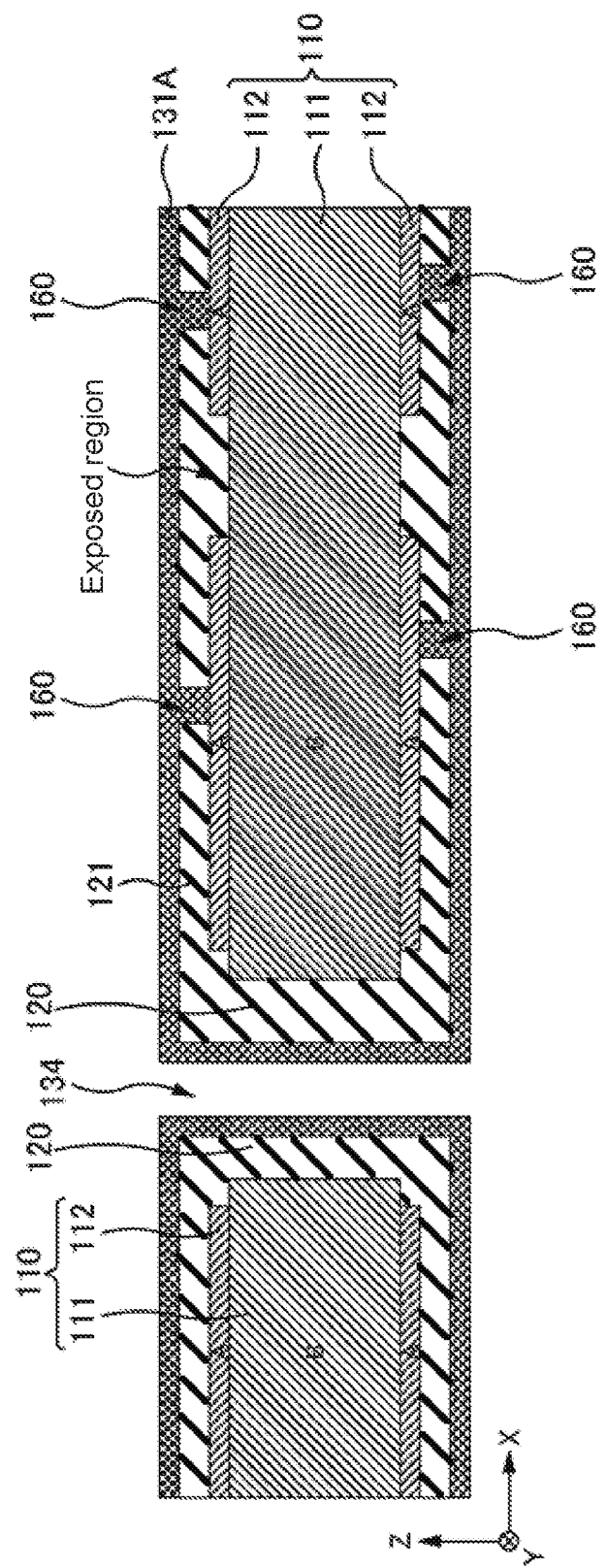
FIG. 5F is a view that describes the method of manufacturing the intermediate printed board according to the embodiment shown in FIG. 1A.

Then, as shown in FIG. 5F, the interior of the through-hole 134 and the holes 160 is filled, and, in order to cover the surface of the first insulating layer 121, a metal cover layer 131A is formed via plating. Note that the metal cover layer 131A that will become the conductive pattern 130 is generally made of copper.

Figure 5G:
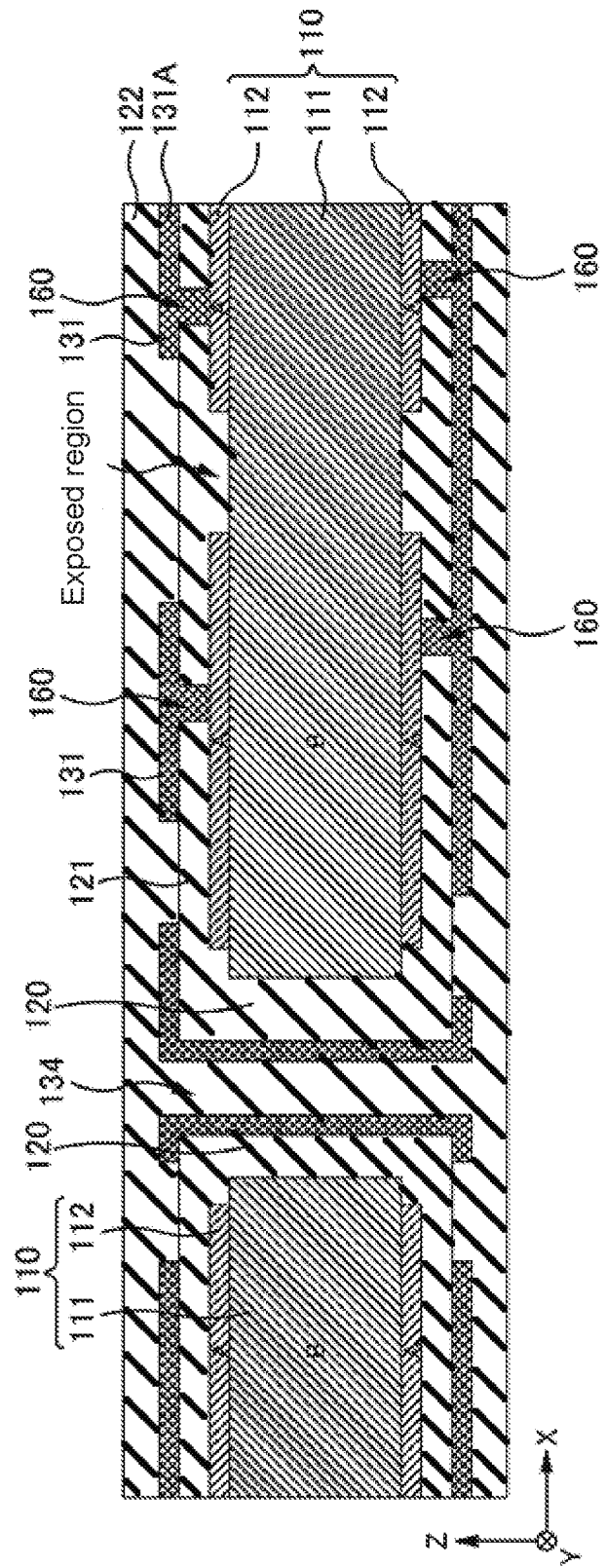
FIG. 5G is a view that describes the method of manufacturing the intermediate printed board according to the embodiment shown in FIG. 1A.

Next, as shown in FIG. 5G, the metal cover layer 131A that was formed on both sides of the first insulating layer is patterned via wet etching, for example, thereby forming the first conductive pattern 131. The first conductive pattern 131 forms wiring and electrodes. The wiring or electrodes of the first conductive pattern 131 for which a substrate ground is necessary are electrically connected to the metal layer 111 and the plating layer 112 via the holes 160. The holes 160 are via, for example.

Figure 5H:
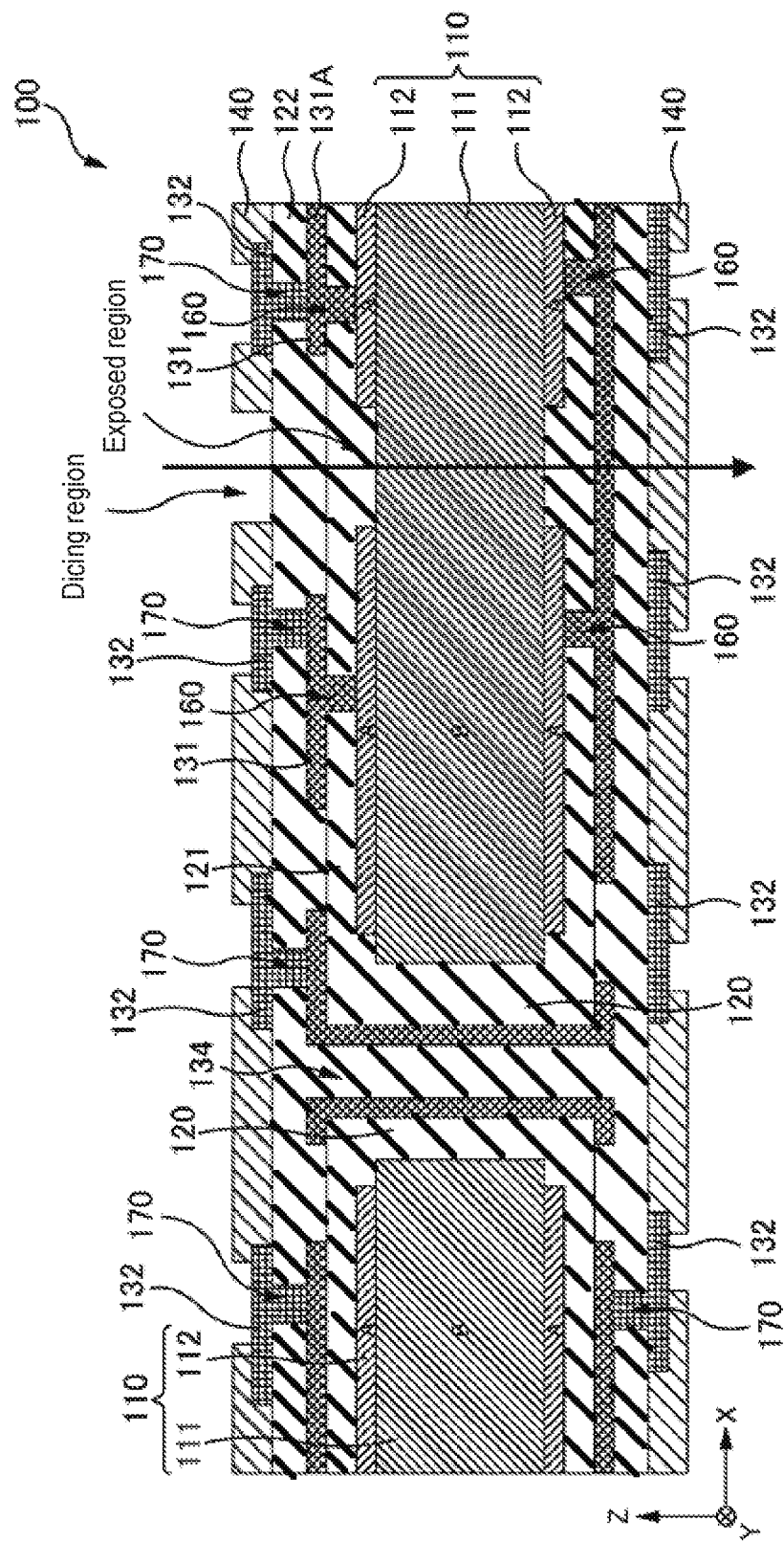
FIG. 5H is a view that describes the method of manufacturing the intermediate printed board according to the embodiment shown in FIG. 1A.
Figure 5I:
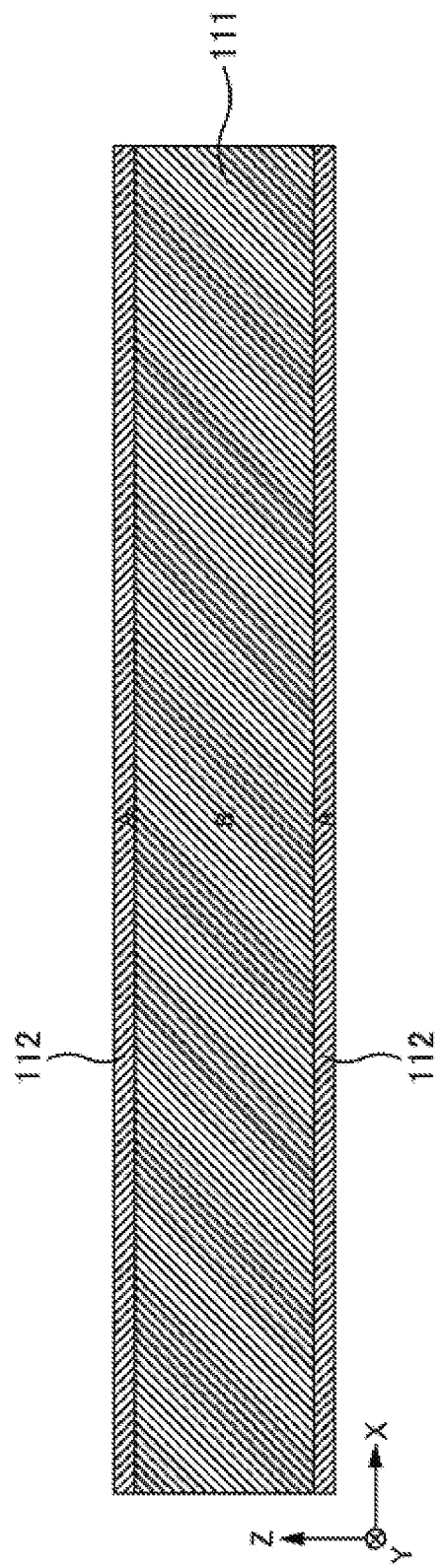
FIG. 5I is a view that describes the method of manufacturing the intermediate printed board according to the embodiment shown in FIG. 1A.
Figure 5J:
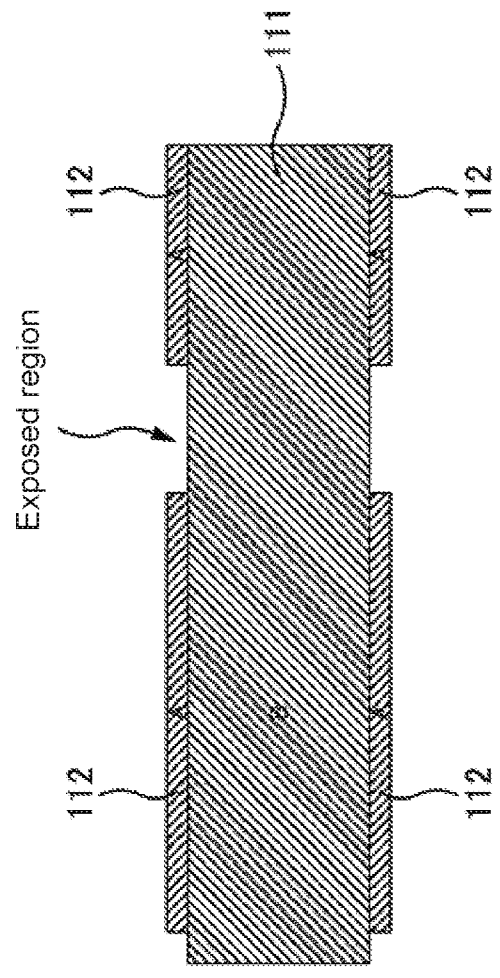
FIG. 5J is a view that describes the method of manufacturing the intermediate printed board according to the embodiment shown in FIG. 1A.
Figure 5J:
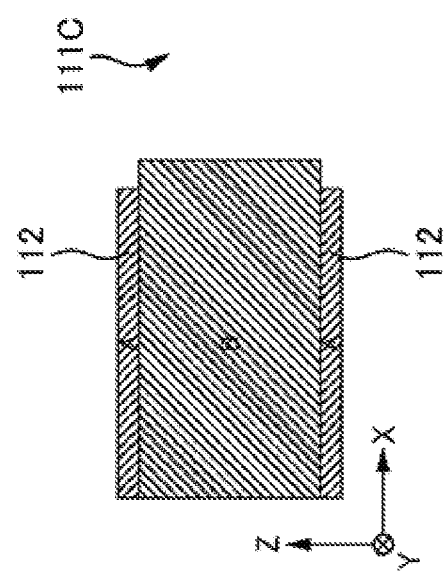

Furthermore, the second insulating layer 122 is formed to both cover the front surface and rear surface of the board 100 and to cover the front surface of the first conductive pattern 131. Holes 170 are then formed in the second insulating layer 122 via etching or laser processing (FIG. 5H). A second metal cover layer (not shown) is formed via plating so as fill the interior of the holes 170 and to be disposed on the entire surface of the second insulating layer 122. Then, as shown in FIG. 5H, the second metal cover layer is patterned, forming the second conductive pattern 132.

Next, the solder resist layer 140 is formed on the surface of the board. Specifically, the solder resist layer 140 is formed so as to cover the surface of the second insulating layer 122 and the second conductive patterns 132, and the solder resist 140 is then partially removed via etching (development processing), thereby exposing the second conductive patterns 132 that will become electrodes. The second conductive patterns 132 exposed from the solder resist layer 140 will become electrodes for mounting components, which will be mentioned later, pad electrodes for wire bonding, and the like.

Thereafter, as shown in FIG. 1C, the completed intermediate printed board 100 is cut via a dicing apparatus, for example, and divided into individual pieces. Thereafter, camera components such as imaging elements, in this case semiconductor chips and passive components, are mounted on the individually-divided printed circuit boards 101, for example. Note that the arrow pointing in the −Z direction in FIG. 5H indicates the thickness direction of the board that will be diced, and, as shown in FIGS. 1B and 1D, is scanned in a grid pattern.

As described above, in the present embodiment, since the strength is higher than for a board of the same thickness in which the metal core substrate 110 is formed of only the second metallic material (copper, for example), it is possible to obtain a printed circuit board 101 that is thin but strong.

This is because a board that is strong, rigid, and flat despite being thin can be obtained by using a metallic material that is harder than copper as the metal layer 111. In particular, by using stainless steel, it is possible to increase the rigidity higher than that of copper, and it is possible to manufacture the board at a relatively low cost; thus, using stainless steel is preferred.

In addition, it is possible to increase the electric conductivity of the metal core substrate 110 higher than that of a substrate formed of only the first metallic material (stainless steel, for example). Therefore, it is possible to achieve a low resistance and to suppress the generation of heat in the substrate itself.

In addition, since it is possible to obtain a metal core substrate 110 that has higher thermal conductivity than a substrate formed of only the first metallic material, it is possible to obtain a printed circuit board 101 that has superior heat-dissipating characteristics compared to a board formed of only the first metallic material.

Furthermore, a metallic material with a higher modulus of elasticity than copper is used in the metal layer 111, and the plating layers 112 are not formed on the exposed regions of the metal layer 111. As a result, the rigidity of the printed circuit board 101 is ensured, and burrs will not occur when the exposed regions are diced.

===Other Embodiments===

Figure 6:
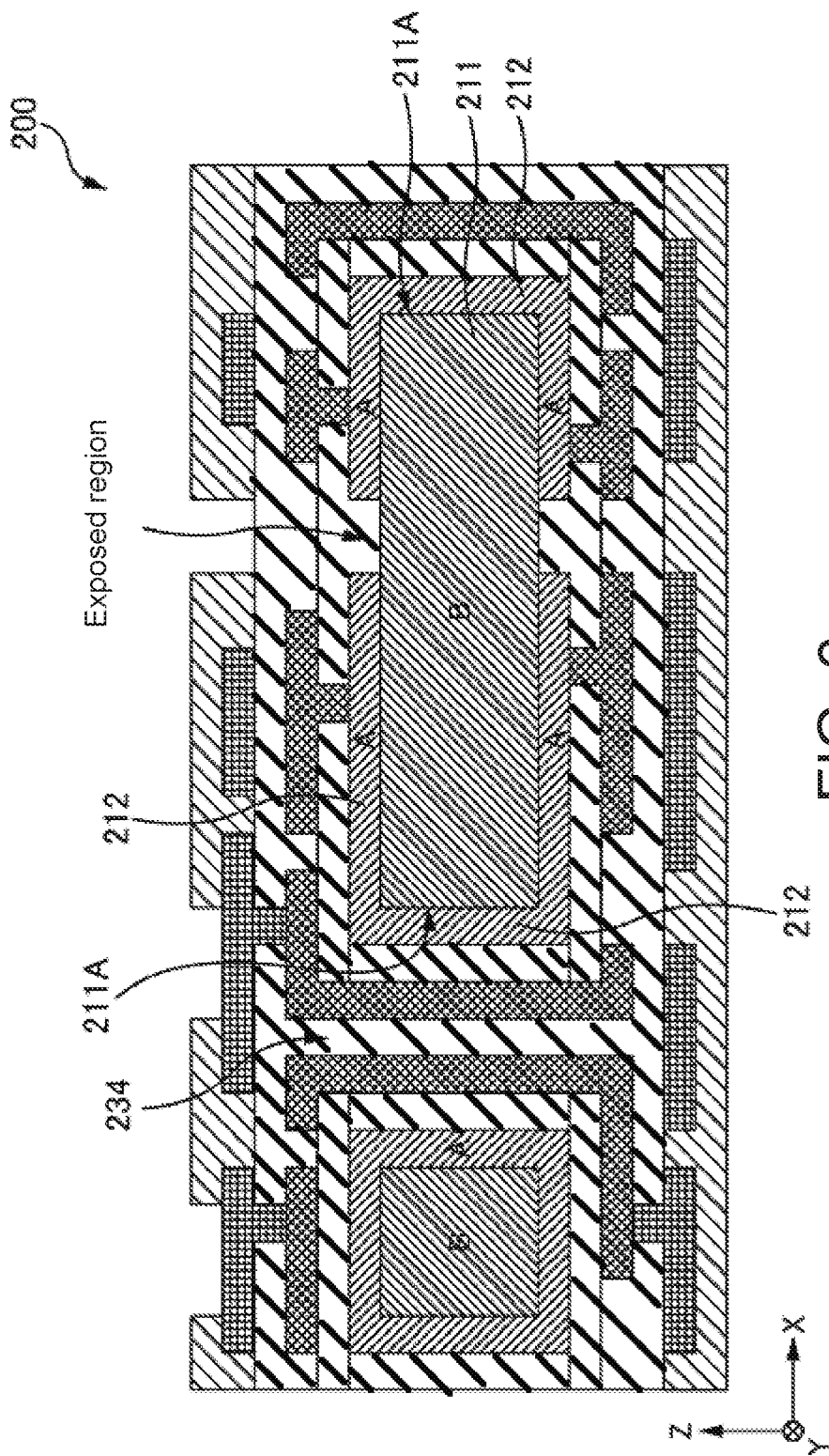
FIG. 6 is a cross-sectional view that schematically shows an intermediate printed board according to another embodiment in which a plating layer is formed on first side surfaces of a metal layer.
Figure 7A:
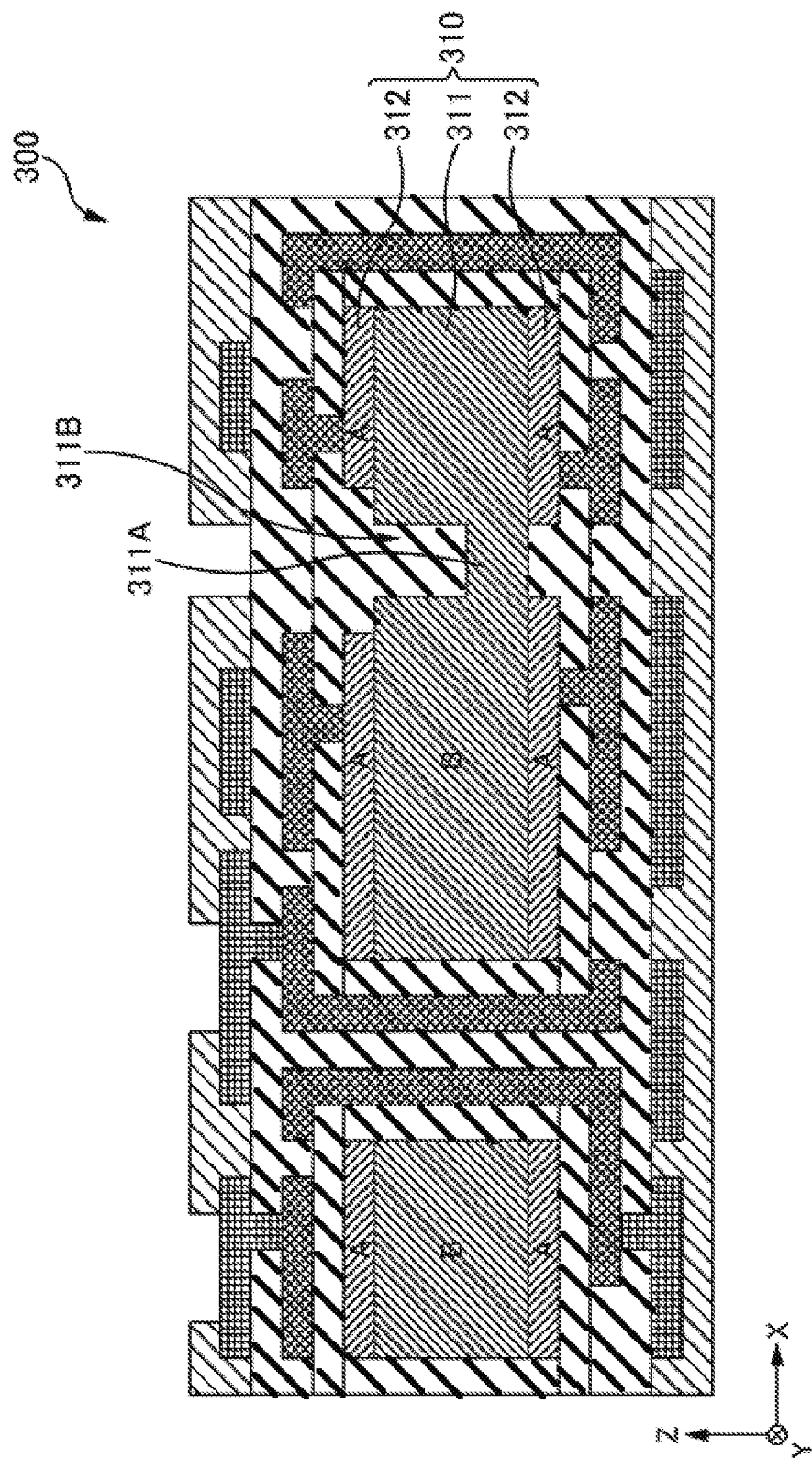
FIG. 7A is a cross-sectional view that schematically shows an intermediate printed board according to another embodiment in which a portion of a metal layer has been formed thinner.
Figure 7B:
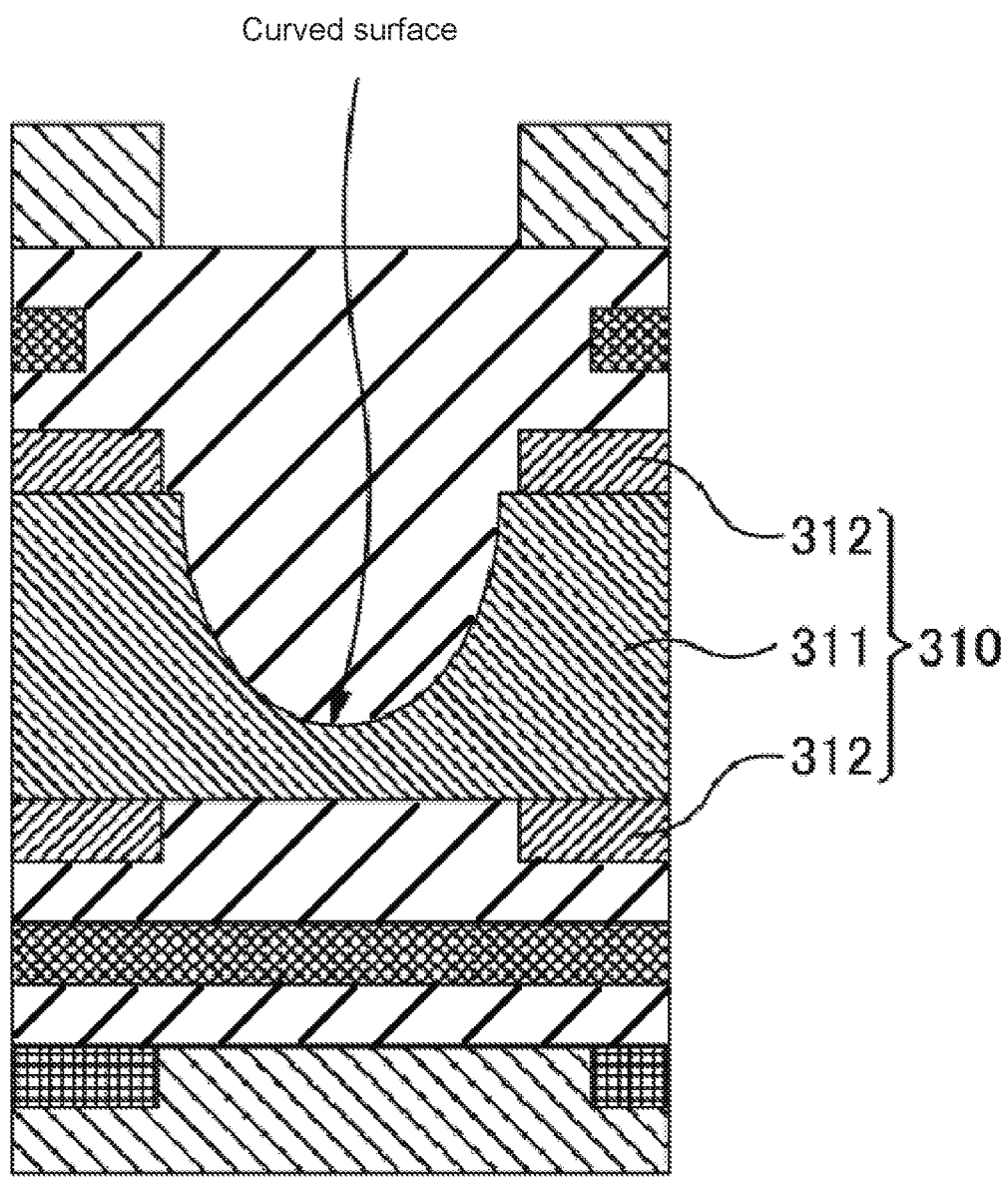
FIG. 7B is an enlarged cross-sectional view of a metal layer of an intermediate printed board according to another embodiment in which a portion of the metal layer is formed thinner and a curved surface is formed on one surface of the metal layer.
Figure 7C:
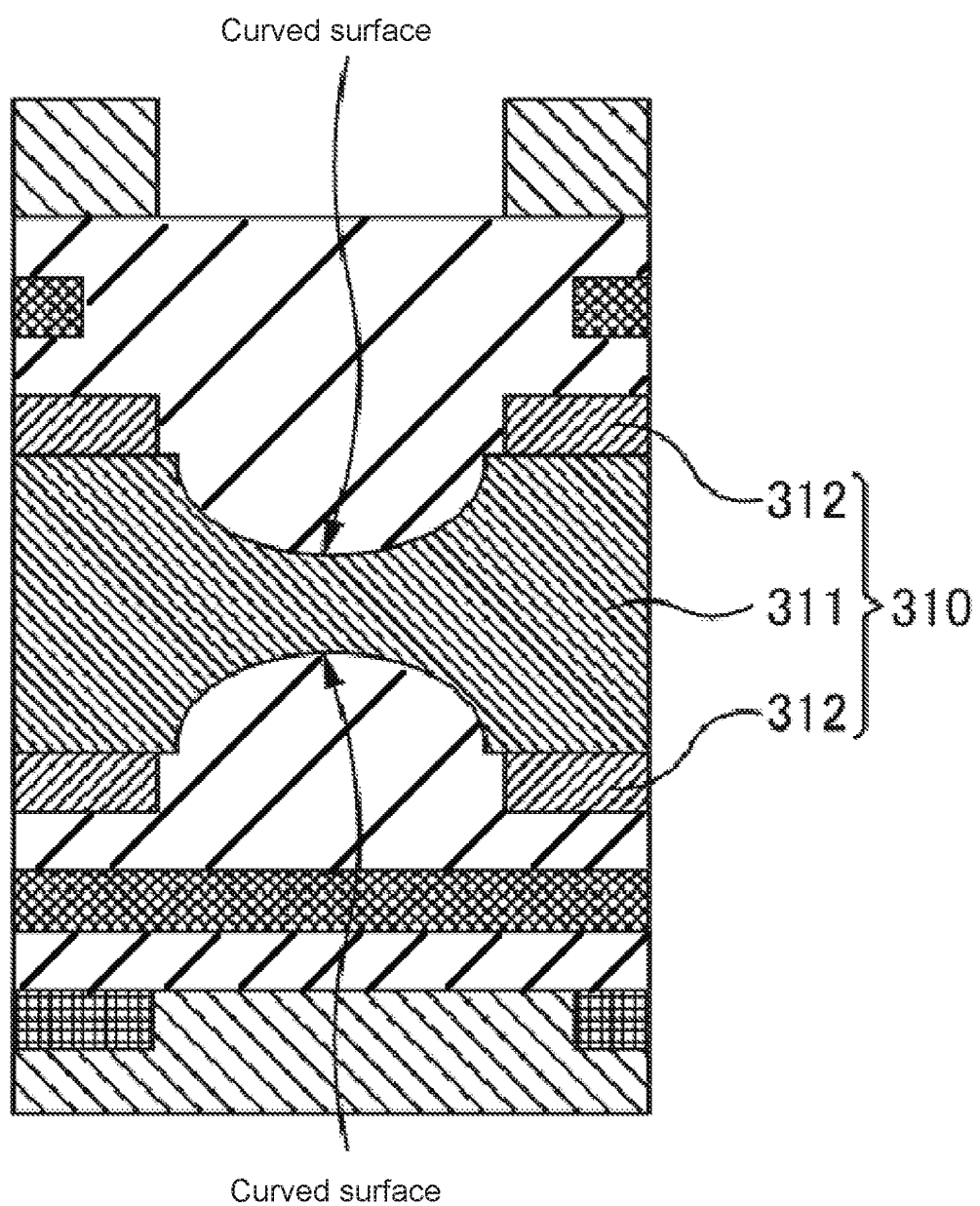
FIG. 7C is an enlarged cross-sectional view of a metal layer of an intermediate printed board according to another embodiment in which a portion of the metal is formed thinner and curved surfaces are formed on both surfaces of the metal layer.
Figure 8:
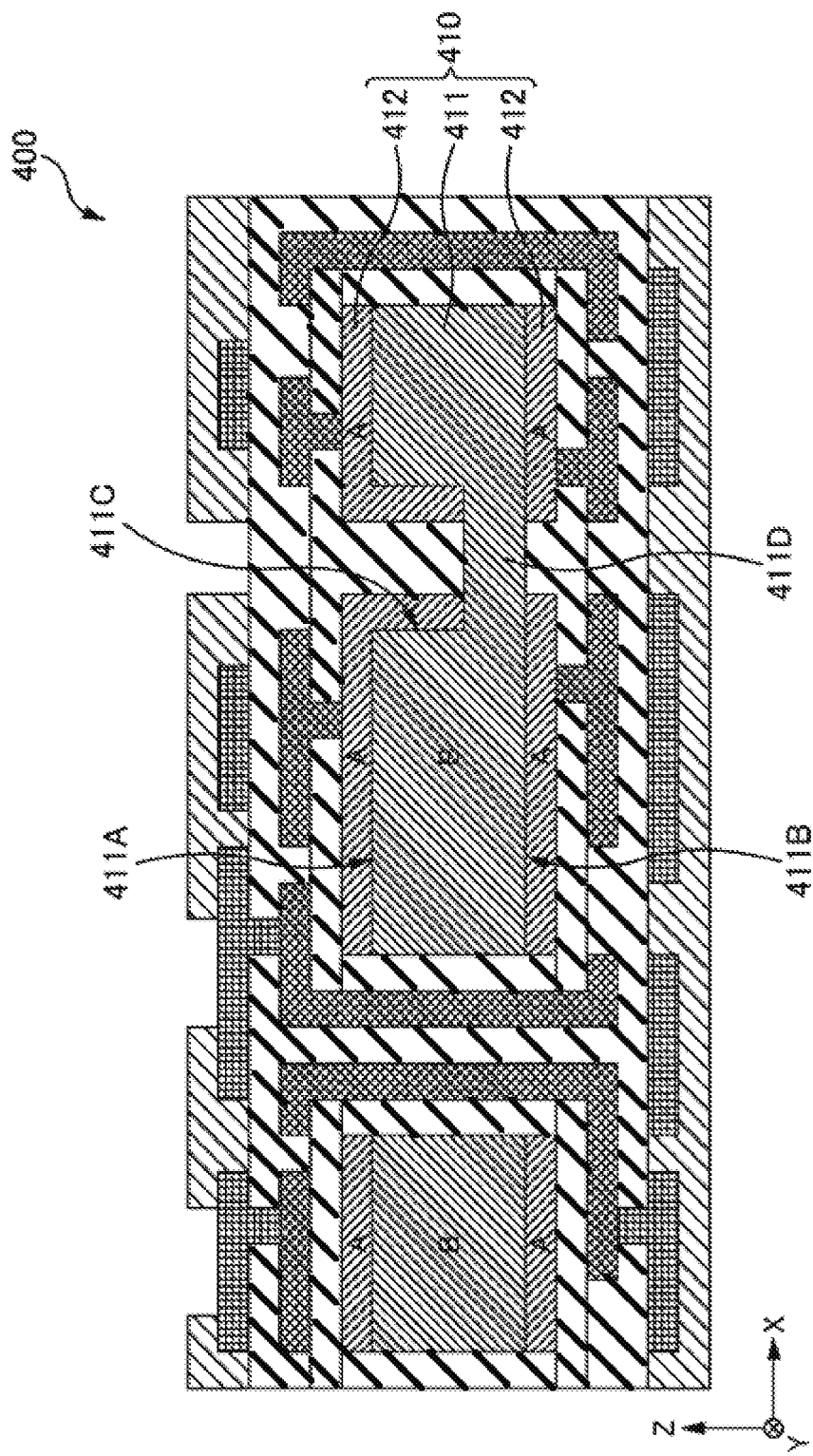
FIG. 8 is a cross-sectional view that schematically shows an intermediate printed board according to another embodiment in which a plating layer is formed on second side surfaces of a metal layer.
Figure 9:
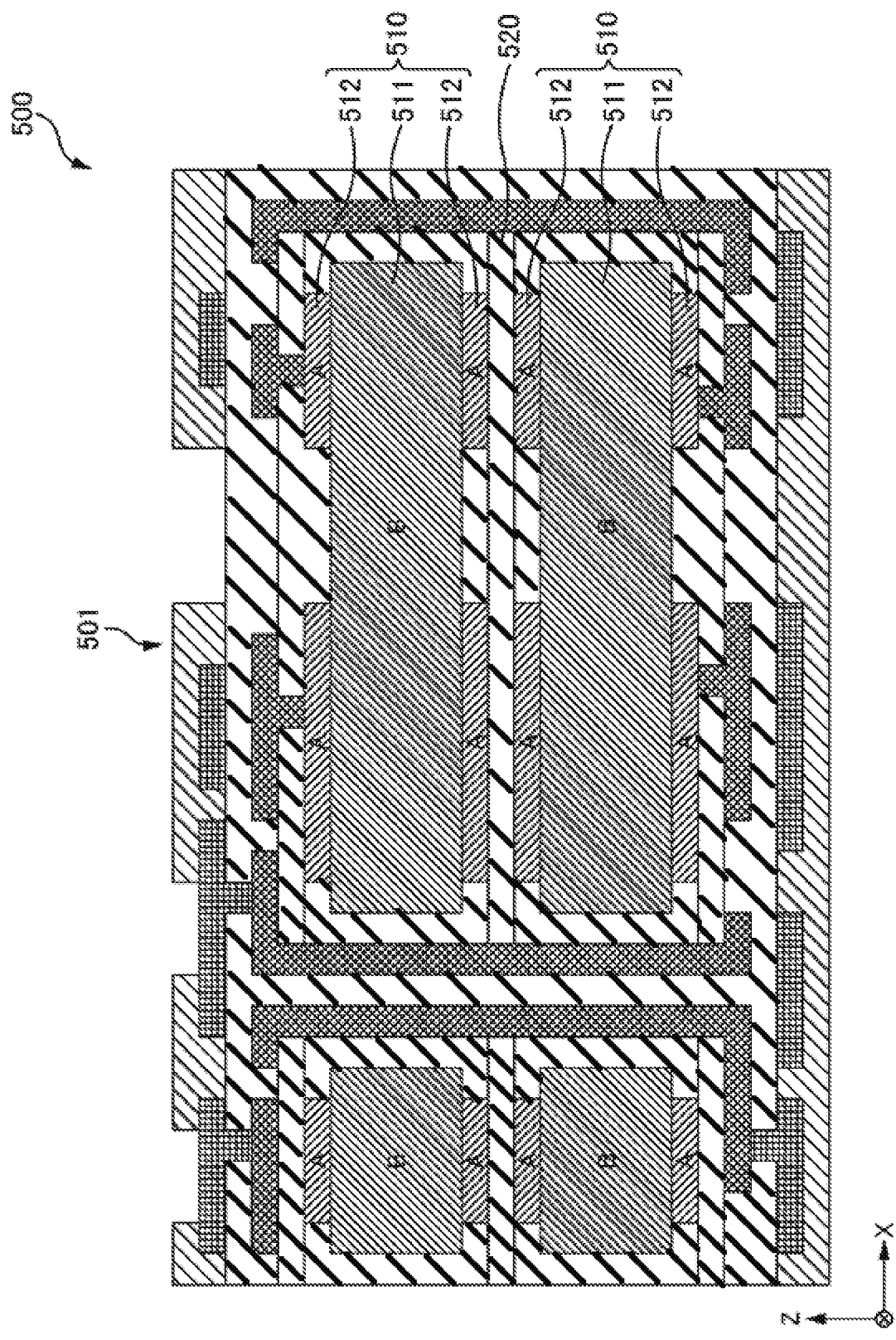
FIG. 9 is a cross-sectional view that schematically shows an intermediate printed board according to another embodiment in which a plurality of metal core substrates are formed in a stack with an insulating layer therebetween.

Other embodiments will be described below with reference to FIGS. 6, 7A, 7B, 7C, 8, and 9. FIG. 6 is a cross-sectional view that schematically shows an intermediate printed board 200 according to another embodiment in which a plating layer 212 is formed on first side surfaces 211A of a metal layer 211. FIG. 7A is a cross-sectional view that schematically shows an intermediate printed board 300 according to another embodiment in which a portion of a metal layer 311 is formed thinner. FIG. 7B is an enlarged cross-sectional view of a metal layer 311 of an intermediate printed board 300 according to another embodiment in which a portion of the metal layer 311 is formed thinner and a curved surface is formed on one surface of the metal layer 311. FIG. 7C is an enlarged cross-sectional view of a metal layer 311 of an intermediate printed board 300 according to another embodiment in which a portion of the metal layer 311 is formed thin and curved surfaces are formed on both surfaces of the metal layer 311. FIG. 8 is a cross-sectional view that schematically shows an intermediate printed board 400 according to another embodiment in which a plating layer 412 is formed on second side surfaces 411C of a metal layer 411. FIG. 9 is a cross-sectional view that schematically shows an intermediate printed board 500 according to another embodiment in which a plurality of metal core substrates 510 are formed in a stack with an insulating layer 520 therebetween.

Note that, in the following description, only the differences from the embodiment shown in FIGS. 1A and 1C will be described, and in FIGS. 6 to 9, reference characters have be assigned only to constituting elements that are different from the embodiment shown in FIGS. 1A and 1C.

Here, in FIGS. 6 to 9, a thickness direction of the printed circuit boards 201 to 501 is defined as the Z direction, a direction moving inward from the front of the paper surface of drawing in a plane orthogonal to the Z axis is set as the Y direction, and a direction orthogonal to the Y axis and the Z axis is set as the X direction. In FIGS. 7A through 9, the metal layer 311 (411, 511) made of the first metallic material, and plating layers 312 (412, 512) formed on the metal layer and made of the second metallic material constitute a metal core substrate 310 (410, 510).

The intermediate printed board 200 according to the embodiment shown in FIG. 6 is a printed board in which the plating layer 212 is formed on the inner walls of a through-hole 234 in the metal layer 211. This configuration can be realized in FIG. 5B by performing plating while omitting the sheet 111D that covers the penetrating holes 111C. Since the inner walls of the through-hole 234 are covered using a conductive film, it is possible to increase electric conductivity and thermal conductivity. In addition, since the inner walls of the through-hole are also a plating layer, adhesion with an insulating resin increases.

Next, as shown in FIG. 7A, a cut portion that represents an exposed region of the metal layer 311 may be formed thin in the Z direction. As a result, it is possible to reduce the amount of metallic material for the metal layer 311, and it is possible to further suppress the occurrence of burrs when a cut portion 311A is diced. Such an intermediate printed board 300 is manufactured by removing the plating layers 312 which have been respectively stacked on both surfaces of the metal layer 311, and then performing etching such that the cut portion 311A becomes thin.

Furthermore, in such a case, as shown in FIG. 7B, one surface in the Z direction of the cut portion 311A may be formed via etching so as to have a curved surface. In addition, as shown in FIG. 7C, both surfaces in the Z direction of the cut portion 311A may be formed via etching so as to be curved surfaces. As a result, in addition to suppressing burrs, it is possible to prevent shorts even if burrs do occur due to the tip of the burrs being located inside a recess.

The intermediate printed board 400 according to the embodiment shown in FIG. 8 is a printed board in which a plating layer 412 is formed on side walls 411C of a recess 311B (shown in FIG. 7A). By increasing the area in which the plating layer 412 is formed on the metal layer 411, it is possible to increase the electric conductivity and thermal conductivity of the intermediate printed board 400. In FIG. 8, a cut portion 411D is formed in the same manner as the cut portion 311A shown in FIG. 7A.

As shown in FIG. 9, the metal core substrates 510 may be configured so as to be stacked with an insulating resin therebetween. As a result, if a thin element is built in by forming a cavity in the upper metal core layer and both metal core layers are thinned, it is possible to use the element as microscopic wiring layers and electrodes.

===SUMMARY===

As described above, the intermediate printed board 100 is an intermediate printed board 100 having a plurality of placement regions on which a plurality of unit boards are provided, the intermediate printed board including: the metal core substrate 110 having the metal layer 111, and the plating layers 112 formed on the first primary surface 111A of the metal layer 111 and on the second primary surface 111B of the metal layer 111 opposite of the first primary surface 111A so as to form an exposed region in the metal layer 111 that corresponds to the space between adjacent placement regions; the insulating layers 120 formed so as to cover the surfaces of the metal core substrate 110; and the conductive pattern 130 that is formed on the insulating layers 120 corresponding to the placement regions. According to this embodiment, the metal core substrate that corresponds to the dicing region becomes an exposed region in which the plating layers have been omitted; thus, it is possible to prevent burrs during dicing. As a result, it is possible to provide a higher-quality intermediate printed board 100. Since Cu in particular is lightweight and likely to have burrs, it is possible to prevent the occurrence of burrs by eliminating copper in the dicing region.

In addition, the metal layer 111 of the intermediate printed board 100 is formed of a metallic material of which the primary material is iron or a metallic material of which the primary material is aluminum. According to this embodiment, the intermediate printed board 100 is able to have a stronger rigidity than copper, which is often used as the metal layer 111; thus, it is possible to maintain flatness.

In addition, the plating layers 212, 412 of the intermediate printed boards 200, 400 are further formed on first side surfaces (third primary surfaces) of the metal layers 211, 411, the first side surfaces being formed perpendicular to the first primary surface (411A in FIG. 8) and the second primary surface (411B in FIG. 8). According to these embodiments, by increasing the area in which the plating layers 212, 412 are formed on the metal layers 211, 411, it is possible to increase the electric conductivity and thermal conductivity of the intermediate printed boards 200, 400.

In addition, the plating layers 112 of the intermediate printed board 100 are formed of a metallic material of which the primary material is copper. According to the above embodiments, the plating layers 112 have higher electric conductivity and thermal conductivity than stainless steel, for example, which forms the metal layer 111; thus, it is possible to improve the function of the metal core substrate 110 as a ground and the function as a heat-dissipating member.

In addition, the plating layer 112 of the intermediate printed board 100 has a polycrystalline structure, and the surface of the plating layer 112 that contacts the insulating layer 120 has surface irregularities in order to increase the adhesion between the plating layer 112 and the insulating layer 120. According to such embodiments, it is possible to improve the adhesion between the plating layer 112 and the insulating layer 120.

In addition, the reinforcing fiber sheet 123 formed of reinforced fibers is embedded in the insulating layer 120 of the intermediate printed board 100. According to such embodiments, by improving adhesion with an insulating resin, it is possible to increase the rigidity of the intermediate printed board 100.

In addition, in the metal layer 311 of the intermediate printed board 300, the cut portion 311A (first metal portion) of the metal layer 311 in the exposed region is formed thinner compared to the metal layer 311 outside the exposed region. According to this embodiment, it is possible to suppress the amount of burrs that occur or to shorten the length of the burrs. Furthermore, it is possible to suppress the load on the blade.

Embodiments of the present invention were described above, but the present invention is not limited thereto. The material, shape, and placement of the various above-described members are merely embodiments for implementing the present invention, and various modifications can be made as long as these modifications do not depart from the spirit of the invention.

Furthermore, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. An intermediate printed board having a plurality of unit regions that are to be cut out and separated to become a plurality of individual printed circuit boards, respectively, the intermediate printed board comprising:

a metal core substrate including:

a metal layer made of a metallic material that includes iron or aluminum as a primary material; and a plating layer made of a metallic material having copper as a primary material and formed on each of a top surface and a bottom surface of the metal layer, the plating layer being absent in each of cutting regions and exposing the metal layer, the cutting regions being regions on the intermediate printed board where the plurality of unit regions are separated so as to produce the plurality of individual printed circuit boards;

an insulating layer formed so as to cover a surface of the metal core substrate; and a conductive pattern formed on the insulating layer, wherein an area where the plating layer is absent and is exposing the metal layer is wider than each of the cutting regions so that a cutting operation at the cutting region does not cut the plating layer, and wherein at least a portion of the metal layer in said area where the plating layer is absent and is exposing the metal layer has a same thickness as the metal layer that has the plating layer thereon.

2. The intermediate printed board according to claim 1, wherein in each of the cutting regions, the metal layer straddles adjacent two of the unit regions that are separated by the cutting region therebetween, and each of the cutting regions has an area in a plan view where the metal layer is absent.

3. The intermediate printed board according to claim 1, wherein the metal layer is made of stainless steel.

4. The intermediate printed board according to claim 1, wherein the metal layer is made of the metallic material that includes iron as the primary material.

5. The intermediate printed board according to claim 1, wherein the plating layer is further formed on side faces of the metal layer.

6. The intermediate printed board according to claim 1, wherein the plating layer has a polycrystalline structure, and wherein a surface of the plating layer that contacts the insulating layer has surface irregularities for increasing adhesion between the plating layer and the insulating layer.

7. The intermediate printed board according to claim 1, wherein a sheet formed of reinforced fibers is embedded in the insulating layer.

8. The intermediate printed board according to claim 1, wherein said metal core substrate is provided in a plurality, and the plurality of the metal core substrates are stacked together with an insulating resin therebetween, and wherein the insulating layer covers a topmost one of the plurality of metal core substrates.

9. The intermediate printed board according to claim 1, wherein the metal layer is thinner in the cutting regions than in the unit regions.

10. A method for manufacturing printed circuit boards, comprising:

preparing an intermediate printed board having a plurality of unit regions that are to be cut out and separated to become a plurality of individual printed circuit boards, respectively, the intermediate printed board comprising:

a metal core substrate including:

a metal layer made of a metallic material that includes iron or aluminum as a primary material; and a plating layer made of a metallic material having copper as a primary material and formed on each of a top surface and a bottom surface of the metal layer, the plating layer being absent in each of cutting regions and exposing the metal layer, the cutting regions being regions on the intermediate printed board where the plurality of unit regions are separated so as to produce the plurality of individual printed circuit boards;

an insulating layer formed so as to cover a surface of the metal core substrate; and a conductive pattern formed on the insulating layer; and mechanically cutting the intermediate printed board at the cutting regions so as to cut out and separate the plurality of unit regions into the plurality of individual printed circuit boards, wherein an area where the plating layer is absent and is exposing the metal layer is wider than each of the cutting regions so that the step of mechanically cutting does not cut the plating layer, and wherein at least a portion of the metal layer in said area where the plating layer is absent and is exposing the metal layer has a same thickness as the metal layer that has the plating layer thereon.

11. The method according to claim 9, wherein in each of the cutting regions of the prepared intermediate printed board, the metal layer straddles adjacent two of the unit regions that are separated by the cutting region therebetween, and each of the cutting regions has an area in a plan view where the metal layer is absent.

12. The method according to claim 9, wherein the metal layer is made of stainless steel.

13. The method according to claim 9, wherein the metal layer is made of the metallic material that includes iron as the primary material.

14. The method according to claim 10, wherein the metal layer is thinner in the cutting regions than in the unit regions., and wherein the step of mechanically cutting the intermediate printed board exposes a side face of the metal layer.

15. The method according to claim 9, wherein the step of mechanically cutting the intermediate printed board is performed using a dicing apparatus.

* * * * *